(12) United States Patent
Murashima

(10) Patent No.: US 10,750,090 B2
(45) Date of Patent: Aug. 18, 2020

(54) SEMICONDUCTOR DEVICE AND ELECTRONIC DEVICE

(71) Applicant: RENESAS ELECTRONICS CORPORATION, Tokyo (JP)

(72) Inventor: Ryuichi Murashima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 8 days.

(21) Appl. No.: 16/175,425

(22) Filed: Oct. 30, 2018

(65) Prior Publication Data

US 2019/0191088 A1    Jun. 20, 2019

(30) Foreign Application Priority Data

Dec. 14, 2017  (JP) ................................ 2017-239337

(51) Int. Cl.
*H04N 5/232* (2006.01)
*H01L 27/146* (2006.01)
*G02B 27/64* (2006.01)

(52) U.S. Cl.
CPC ....... *H04N 5/23258* (2013.01); *G02B 27/646* (2013.01); *H01L 27/146* (2013.01); *H04N 5/2327* (2013.01); *H04N 5/2329* (2013.01); *H04N 5/23248* (2013.01); *H04N 5/23267* (2013.01); *H04N 5/23287* (2013.01)

(58) Field of Classification Search
None
See application file for complete search history.

(56) References Cited

U.S. PATENT DOCUMENTS

| 7,522,188 | B2 * | 4/2009 | Tomita | ............... | H04N 5/23248 |
| | | | | | 348/208.1 |
| 8,098,286 | B2 | 1/2012 | Nakakuki et al. | | |
| 2014/0267807 | A1 * | 9/2014 | Miyahara | ........... | H04N 5/23274 |
| | | | | | 348/208.3 |

FOREIGN PATENT DOCUMENTS

JP    2009-152793 A    7/2009

* cited by examiner

*Primary Examiner* — Quan Pham
(74) *Attorney, Agent, or Firm* — McDermott Will & Emery LLP

(57) ABSTRACT

A semiconductor device for use in controlling a camera module performs position adjustment of a correction lens for use in optical camera shake correction, based on information representing a present position of the correction lens and position information of an output image of electronic camera shake correction with respect to a photographed image photographed by an imaging element. As a result, an operation margin of the correction lens is kept, while keeping a correction margin for the electronic camera shake correction.

15 Claims, 22 Drawing Sheets

FIG. 9

| OIS \ EIS (-5.0°≦Ey≦5.0°) / (-1.5°≦Oy≦1.5°) | (e) SMALL MARGIN ON LOWER END<br>9.0°<EMY1≦10.0°<br>0.0°≦EMY2<1.0°<br>(-5.0°≦Ey<-4.0°) | (f) LOWER SIDE FROM CENTER<br>5.0°<EMY1≦9.0°<br>1.0°≦EMY2<5.0°<br>(-4.0°≦Ey<0.0°) | (g) UPPER SIDE FROM CENTER<br>1.0°≦EMY1≦5.0°<br>5.0°≦EMY2≦9.0°<br>(0.0°≦Ey≦4.0°) | (h) SMALL MARGIN ON UPPER END<br>0.0°≦EMY1<1.0°<br>9.0°<EMY2≦10.0°<br>(4.0°<Ey≦5.0°) |
|---|---|---|---|---|
| (a) SMALL MARGIN ON LOWER END<br>2.5°<OMY1≦3.0°<br>0.0°≦OMY2<0.5°<br>(-1.5°≦Oy<-1.0°) | NOT ADJUST POSITION OF CORRECTION LENS | SET POSITION OF CORRECTION LENS TO OMY1=OMY2=1.5° (Oy=0.0°) | SET POSITION OF CORRECTION LENS TO OMY1=0.5°, OMY2=2.5° (Oy=1.0°) | SET POSITION OF CORRECTION LENS TO OMY1=0.5°, OMY2=2.5° (Oy=1.0°) |
| (b) LOWER SIDE FROM CENTER<br>1.5°<OMY1≦2.5°<br>0.5°≦OMY2<1.5°<br>(-1.0°≦Oy<0.0°) | NOT ADJUST POSITION OF CORRECTION LENS | NOT ADJUST POSITION OF CORRECTION LENS | SET POSITION OF CORRECTION LENS TO OMY1=0.5°, OMY2=2.5° (Oy=1.0°) | SET POSITION OF CORRECTION LENS TO OMY1=0.5°, OMY2=2.5° (Oy=1.0°) |
| (c) UPPER SIDE FROM CENTER<br>0.5°≦OMY1≦1.5°<br>1.5°≦OMY2≦2.5°<br>(0.0°≦Oy≦1.0°) | SET POSITION OF CORRECTION LENS TO OMY1=2.5°, OMY2=0.5° (Oy=-1.0°) | NOT ADJUST POSITION OF CORRECTION LENS | NOT ADJUST POSITION OF CORRECTION LENS | NOT ADJUST POSITION OF CORRECTION LENS |
| (d) SMALL MARGIN ON UPPER END<br>0.0°≦OMY1<0.5°<br>2.5°<OMY2≦3.0°<br>(1.0°<Oy≦1.5°) | SET POSITION OF CORRECTION LENS TO OMY1=2.5°, OMY2=0.5° (Oy=-1.0°) | SET POSITION OF CORRECTION LENS TO OMY1=OMY2=1.5° (Oy=0.0°) | SET POSITION OF CORRECTION LENS TO OMY1=OMY2=1.5° (Oy=0.0°) | NOT ADJUST POSITION OF CORRECTION LENS |

| EIS + OIS CORRECTION ADJUSTMENT REPORT (EXAMPLE) | | | | | |
|---|---|---|---|---|---|
| Vsync | OIS_X | OIS_Y | EIS_X | EIS_Y | ERR |
| 0000 | +0.00 | +0.00 | +0.00 | +0.00 | -- |
| 0001 | +0.01 | +0.34 | +0.10 | +0.20 | -- |
| 0002 | +0.10 | +0.54 | +1.00 | +0.80 | -- |
| 0003 | +0.75 | +1.02 | +1.40 | +2.10 | -- |
| 0004 | +0.88 | +1.50 | +1.00 | +4.50 | O- |
| 0005 | +0.22 | +1.50 | +0.20 | +5.00 | OE |
| 0006 | -0.34 | +1.27 | -0.10 | +5.00 | -E |
| 0007 | -0.62 | +1.04 | -0.40 | +3.70 | -- |
| 0008 | -1.10 | +0.93 | -0.50 | +1.50 | -- |
| 0009 | -0.84 | +0.72 | -0.20 | +0.10 | -- |

CORRECTION RANGE DEVIATION WARNING

SEMICONDUCTOR DEVICE AND ELECTRONIC DEVICE

CROSS-REFERENCE TO RELATED APPLICATIONS

The disclosure of Japanese Patent Application No. 2017-239337 filed on Dec. 14, 2017 including the specification, drawings and abstract is incorporated herein by reference in its entirety.

BACKGROUND

The present invention relates to a semiconductor device and an electronic device, and is applicable to a semiconductor device controlling a camera-shake correction function and an electronic device equipped with a camera having the camera-shake correction function.

The camera-shake correction systems in video cameras and digital cameras include an OIS (Optical Image Stabilizer) and an EIS (Electronic Image Stabilizer) (for example, Japanese Unexamined Patent Application Publication No. 2009-152793).

The OIS detects a camera-shake amount at the time of imaging, by a vibration sensor, such as a gyro sensor, in order to adjust the position of a correction lens or an imaging element to reduce an image blur based on the detected camera-shake amount. The feature of the OIS is that the motion blur can effectively and greatly be reduced, because it can adjust the camera shake in a high frequency range with high accuracy.

The EIS is a system for calculating and correcting a moving amount of a photographic object due to the camera shake, by reading a photographed image once into a buffer memory and comparing images photographed at a plurality of points. Because the image needs to be moved in order to eliminate the deviation of the composition, the actual image to be output is the range in which a correction spare region is excluded from the photographed image obtained by the imaging element. The feature of the EIS is that it can correct rhombic or trapezoidal image distortion, perform optical aberration correction, perform rolling shutter distortion correction, and correct distortion in the rotational direction with respect to the optical axis of the lens, with high accuracy.

To simultaneously obtain the correction effects based on the features of the OIS and the EIS, the recent digital cameras and Smartphones with a camera installed therein adopt a correction method combining the OIS and the EIS. In this case, the OIS and the EIS are independently controlled.

SUMMARY

As described above, in the OIS, the correction lens shifts to eliminate the influence of the camera shake detected by the vibration sensor. Thus, if the correction lens for the OIS is repeatedly shifted at the time of photographing a moving image, the correction lens reaches the limit of a shiftable range (hereinafter referred to as a "mechanical end"), and then the OIS may not further be executed.

On the other hand, in the EIS, the position of an output image corresponding to the photographed image is changed, in accordance with the movement of the photographic object which is detected by comparing a plurality of images. Thus, if the position of the output image is repeatedly changed for correcting the camera shake at the time of photographing the moving image, the output image is in contact with the end of the photographed image in the end, and then the EIS may not further be executed.

Because the OIS and the EIS are independently controlled, the function for correcting the camera shake may not sufficiently be performed. For example, when photographing in a rightward range from the original optical axis direction due to the shift of the correction lens for OIS, the position of the output image by the EIS may be in contact with the left end of the photographed image. In this case, if the position of the correction lens is controlled to be back in the center, it is possible to continue the camera shake correction without damaging the EIS. However, in the related art, the above-described cooperative control of the OIS and the EIS is not performed, and has not even been discussed based on its necessity.

Any other objects and new features will be apparent from the descriptions of the present specification and the accompanying drawings.

A semiconductor device for use in controlling a camera module according to an embodiment performs position adjustment for a correction lens for use in the optical camera shake correction, based on information regarding the present position of the correction lens and position information of an output image after electronic camera shake correction for an image photographed by an imaging element.

According to the embodiment, when the OIS and the EIS are both used, it is possible to reduce the risk that either of the OIS and the EIS is outside the correctable range, as compared with the related art.

BRIEF DESCRIPTION OF THE DRAWINGS

FIG. 9 is a diagram illustrating a position adjustment procedure in a vertical direction of the correction lens, in a tabular form.

DETAILED DESCRIPTION

Figure 1:
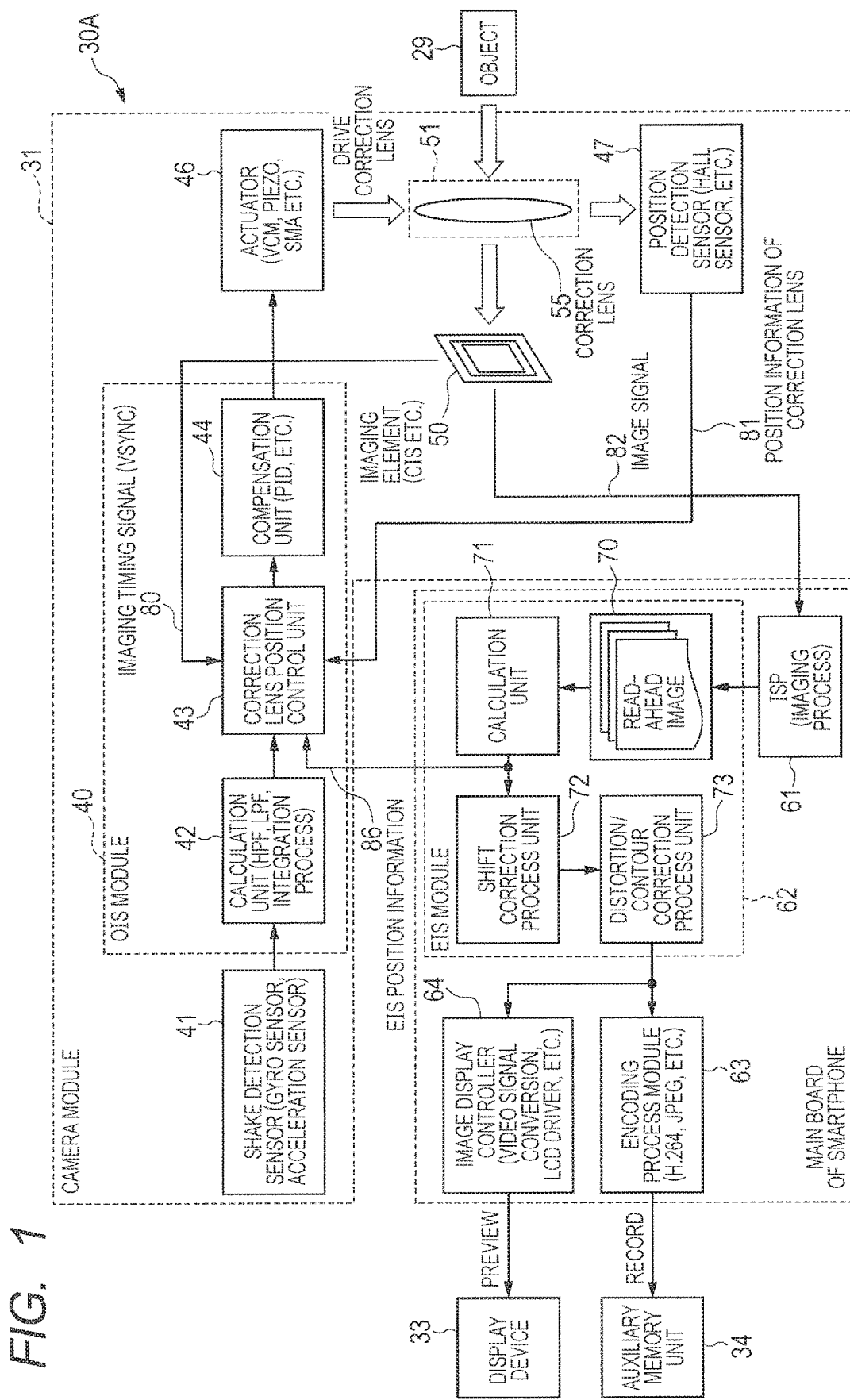
FIG. 1 is a block diagram illustrating a configuration example of an electronic device 30A according to a first embodiment.

Preferred embodiments will hereinafter be described with reference to the accompanying drawings. The same constituent parts or corresponding parts are identified by the same reference numerals, and thus will not be described over and over.

First Embodiment

FIG. 1 is a block diagram illustrating a configuration example of an electronic device 30A according to the first embodiment. Descriptions will hereinafter be made on the assumption that Smartphone with a camera module installed therein is used as the electronic device 30A. The technique of this disclosure is applicable to any other electronic device 30A with the camera module. For example, the electronic device 30A may include a monitor camera system.

In this disclosure, descriptions will be made to an example of camera shake correction with a lens shift system for shifting the correction lens, as a system of the OIS. However, the technique of this disclosure is applicable also to the OIS with any other system. For example, the camera shake correction may be performed by moving the entire optical system, or the camera shake correction may be performed by shifting the entire unit including the optical system and the image sensor. A variable angle prism may be used in place of the correction lens as a correction optical system. Alternatively, the technique of this disclosure is applicable also to the camera shake correction using an image sensor shift system which performs camera shake correction by shifting the imaging element.

In this disclosure, the general term for the correction lens, the optical system, the variable angle prism, and the imaging element is a shiftable object. These are all for displacement or modification for realizing the optical camera shake correction. Thus, the shiftable object is at least one element included in the optical system and the imaging element.

[Entire Configuration of Electronic Device]

As seen from FIG. 1, the electronic device 30A includes, as elements for photographing a photographic object, a camera module 31, a main board 32, a display device 33, and an auxiliary memory unit 34.

(1. Configuration of Camera Module)

The camera module 31 includes an optical system 51 including a correction lens 55, an imaging element (referred to also as an "image sensor") 50, a shake detection sensor 41, an actuator 46, a position detection sensor 47, and an OIS module 40. The shake detection sensor 41, the actuator 46, the position detection sensor 47, the OIS module 40, and the correction lens 55 are used for optical camera shake correction (OIS).

Figure 2:
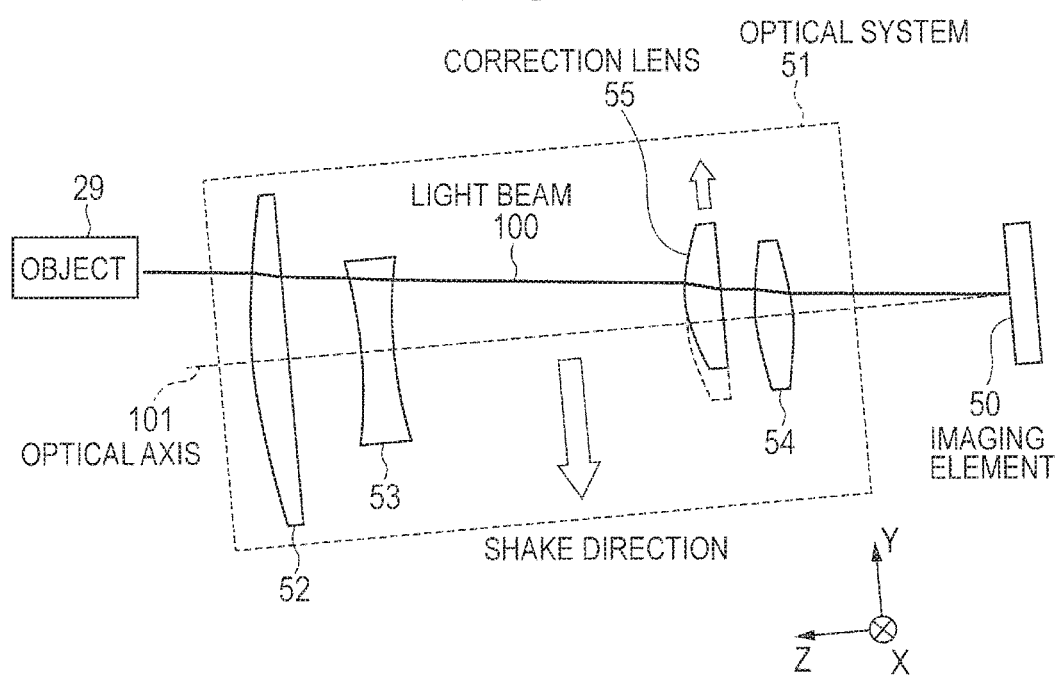
FIG. 2 is a diagram schematically illustrating a configuration example of an optical system 51.

FIG. 2 is a diagram schematically illustrating a configuration example of the optical system 51. The optical system 51 includes optical lenses 52, 53, and 54, the correction lens 55, and a diaphragm (not illustrated).

A light beam 100 from an object enters the optical lenses 52, 53, and 54. The object is formed on the imaging element 50 by the optical lenses 52, 53, and 54. The optical lenses 52, 53, and 54 are arranged in a manner that its optical axis 101 passes through the center of the imaging element 50.

The imaging element 50 is a device for converting an optical image of the object into an electrical signal, and is, for example, a CMOS image sensor (referred also to as a Complementary Metal-Oxide-Semiconductor Image Sensor, CIS). The CMOS image sensor often adopts a rolling shutter system for capturing an image by performing sequential exposure for every line or every few lines.

The correction lens 55 is configured to be shiftable in a plane nearly vertical to the optical axis 101, and corrects an image blur of the object due to the camera shake. Specifically, as illustrated in FIG. 2, in the case of the convex correction lens 55, the correction lens 55 is shifted by an amount corresponding to the blur amount of the optical axis 101 of the optical system 51, in a direction opposite to the shake direction of the optical axis 101 of the optical system 51 due to the camera shake, thereby reducing the blur of the optical image of the object on the imaging element 50.

In the case of the concave correction lens, the correction lens is shifted in the same direction as the shake direction of the optical axis 101 of the optical system 51 due to the camera shake, thereby reducing the blur of the optical image of the object on the imaging element 50. In the case of a sensor shift system for shifting the imaging element 50, the imaging element 50 is shifted in a direction opposite to the shake direction of the optical axis 101 of the optical system 51 due to the camera shake, thereby reducing the blur of the optical image of the object on the imaging element 50. In this manner, using the configuration of the correction optical system or the system of the EIS, it is necessary to pay attention to a point that operation directions of shiftable objects with respect to the camera shake direction are different from each other.

In the case where the correction lens 55 is in an initial position (that is, the center of the shiftable range), the optical axis direction of the optical system 51 is a Z-axis direction, the horizontal direction of the imaging element 50 is an X-axis in a plane vertical to the Z-axis, and the vertical direction of the imaging element 50 is a Y-axis direction. The rotation around the X-axis is referred to as "pitch", the rotation around the Y-axis is referred to as "yaw", and the rotation around the Z-axis is referred to as "roll".

With reference to FIG. 1 again, the shake detection sensor 41 detects the shake direction and the shake amount of the camera module 31 including the optical system 51. The shake detection sensor 41 is, for example, a gyro sensor (referred also to as an angular velocity sensor) or an acceleration sensor. The gyro sensor detects the angular velocity in a yaw direction and a pitch direction (if necessary, the roll direction), based on the optical axis of the camera. The acceleration sensor detects the acceleration in the X-axis direction and the Y-axis direction (if necessary, the Z-axis direction) vertical to the optical axis. Both of the gyro sensor and the acceleration sensor may be provided.

The actuator 46 shifts the correction lens 55 in a plane vertical to the optical axis of the optical system 51, based on a control signal from the OIS module 40. The actuator 46 may, for example, be a VCM (Voice Coil Motor), a piezo element, or an SMA (Shape Memory Alloy) actuator.

The position detection sensor 47 detects the position of the correction lens 55. The position detection sensor 47 is, for example, a Hall sensor. The Hall sensor is configured with a Hall element for detecting the position of the permanent magnet fixed on the frame of the correction lens 55.

The OIS module 40 drives the correction lens 55 using the actuator 46 to reduce the blur of the optical image on the imaging element 50, based on the shake direction and the shake amount of the optical system 51 detected by the shake detection sensor 41. Position control for the correction lens 55 is executed by feedback control based on the present position of the correction lens 55 which is detected by the position detection sensor 47.

(2. Specific Configuration of OIS Module)

In a more specific configuration, the OIS module 40 includes a calculation unit 42, a correction lens position control unit 43, and a compensation unit 44. These constituent elements may be realized by at least one processor executing the program, by a circuit, such as an FPGA (Field Programmable Gate Array) or an ASIC (Application Specific Integrated Circuit), or by a combination thereof.

The calculation unit 42 calculates the shake direction and the shake amount based on the detection value of the shake detection sensor 41. For the above calculation, the calculation unit 42 removes an offset component by applying an HPF (High Pass Filter) to an output signal of the shake detection sensor 41, and removes a noise component by applying an LPF (Low Pass Filter). Further, the calculation unit 42 performs an integration process for an output signal after the above filter process, thereby obtaining the shake amount in association with each coordinate component.

Specifically, when the shake detection sensor 41 is configured with a gyro sensor, the shake amount (that is, the angular shake) in the yaw direction and the pitch direction can be obtained, by integrating the angular velocity in the yaw direction and the pitch direction detected by the gyro sensor. When the shake detection sensor 41 is configured with the acceleration sensor, the velocity in the X-axis direction and the Y-axis direction is obtained by integrating the acceleration in the X-axis direction and the Y-axis direction detected by the acceleration sensor, and the shake amount (that is, shift shake) in the X-direction and the Y-direction is obtained by further integrating the velocity. The shift shake may be converted into the angular shake, based on a distance from the main point of the lens to the photographic object.

Further, the calculation unit 42 calculates a target operation position into which the correction lens 55 is shifted in a manner that the blur of the optical image is reduced on the imaging element, based on the above-described calculated camera shake direction and the camera shake amount. As illustrated in FIG. 2, the shift direction of the convex correction lens 55 is opposite to the camera shake direction in a plane vertical to the optical axis 101.

The correction lens position control unit 43 calculates a deviation between the target operation position of the correction lens 55 output from the calculation unit 42 and a present position of the correction lens 55 output from the position detection sensor 47, and outputs the calculated deviation to the compensation unit 44. As a result that a control signal corresponding to the input deviation is output to the actuator 46 by the compensation unit 44, the position of the correction lens 55 is feedback-controlled in a manner that the present position of the correction lens 55 coincides with the target operation position.

Further, the correction lens position control unit 43 acquires position information 81 of the correction lens 55 output from the position detection sensor 47 and EIS position information 86 output from a calculation unit 71 of an EIS module 62. In this case, the EIS position information 86 represents the position of an output image of the EIS relative to the image photographed by the imaging element 50, as will be described later in FIG. 3. The correction lens position control unit 43 determines whether to change the operation position of the correction lens 55 in order to keep a correction margin of the OIS and the EIS, based on the acquired position information 81 and the EIS position information 86 of the correction lens 55. When to adjust the operation position of the correction lens 55, the correction lens position control unit 43 determines an amount of position adjustment from the present operation position of the correction lens 55 to its appropriate operation position.

In this embodiment, the correction lens position control unit 43 performs the above-described position adjustment for the correction lens 55 in a blanking period. To detect the start of this blanking period, an imaging timing signal, such as a vertical synchronization signal Vsync, is input from the imaging element 50 to the correction lens position control unit 43. In this case, for the sake of convenience, the vertical synchronization signal Vsync is assumed as an imaging timing signal 80 for informing the start of the blanking period. Which signal is used as a signal for starting the blanking period depends on the configuration of the imaging element 50.

The compensation unit 44 generates a control signal for the actuator 46, based on the target operation position and the amount of position adjustment, output from the correction lens position control unit 43. The compensation unit 44 is configured with a PID control unit in which a proportion element (P), an integration element (I), and a differential element (D) are parallelly coupled.

(3. Configuration of Main Board)

On the main board 32 of the electronic device 30A, a plurality of processors, a memory, and a dedicated control unit are mounted. As a configuration corresponding to the camera module, the electronic device 30A includes an image signal processor (ISP) 61, an EIS module 62, an encoding process module 63, and an image display controller 64.

These constituent elements may be configured with at least one dedicated circuit as an SoC (System on Chip), or may be configured with a dedicated circuit in place of a part of the functions and by executing the rest of functions in accordance with a program based on a general processor. In this case, the general processor includes a CPU (Central Processing Unit) and a GPU (Graphics Processing Unit).

The image signal processor 61 performs an image process (also referred to as "an imaging process") for a raw image signal 82 (also referred to as "RAW data") output from the imaging element 50. For example, the image signal processor 61 performs correction of the optical system, correction of defective pixels, removal of noise, and correction of brightness, color, and edge for high quality image.

The EIS module 62 compares photographed images between adjacent frames, thereby calculating and correcting a moving amount due to camera shake in a manner that the photographic object fits in the same screen. More specifically, the EIS module 62 includes a buffer memory 70, a calculation unit 71, a movement correction process unit 72, and a distortion/contour correction process unit 73. The calculation unit 71, the movement correction process unit 72, and the distortion/contour correction process unit 73 can be realized by, for example, a general processor (CPU).

The buffer memory 70 stores image data after processed by the image signal processor 61. The buffer memory 70 stores an image of the present point as image data, in addition to data of one or a plurality of read-ahead images (for example, an image of one preceding frame).

The calculation unit 71 compares images stored in the buffer memory 70 at a plurality of points, thereby calculating a moving amount of the object in the screen. Then, the moving amount in the screen is determined, in a manner that the objects remain in the same screen. That is, the calculation unit 71 determines the position of an output image out from the range of the photographed image based on the size of the imaging element 50. Information regarding the position of the output image is output to the correction lens position control unit 43 as EIS position information 86.

The movement correction process unit 72 performs a process for retrieving output image data from the image data of a corresponding frame (for example, one preceding frame) based on a calculation result of the calculation unit 71, that is, a process for moving the range of the output image.

The distortion/contour correction process unit 73 performs a process for correcting the distortion of the object due to the camera shake and deformation in the contour of the object. For example, the distortion/contour correction process unit 73 corrects the rolling shutter distortion.

The encoding process module 63 converts a data format of an image signal, in order to store the image after corrected by the EIS in the auxiliary memory unit 34. For example, H.264 (MPEG-4 Part 10 Advanced Video Coding) is generally used as a compression encoding system for moving image data. JPEG (Join Photographic Experts Group) is used as a compression encoding system for still images. There is not limitation on the kind of the auxiliary memory unit 34. However, for example, a memory card or a USB (Universal Serial Bus) memory is used.

The image display controller 64 is an integrated circuit for displaying an image signal after corrected by the EIS module 62 on the display device 33. The image display controller 64 and the display device 33 are used for providing a preview for checking the composition of the photograph.

Specifically, the image display controller 64 converts an image signal after corrected by the EIS module 62 into a video signal, such as an RGB signal, corresponding to the display device 33. There is no limitation on the kind of the display device 33. However, for example, an LCD (Liquid Crystal Display) and an organic EL display (Organic Electro-Luminescence Display) are used as the display device 33.

[Correction Margin of OIS and EIS]

Descriptions will now be made to a correction margin of the OIS and the EIS with reference to FIG. 3. Hereinafter, descriptions will be made to a case in which the convex correction lens 55 described in FIG. 2 is shifted, as a system of the OIS. However, it is applicable also to a case in which any other shiftable object is displaced or modified.

Figure 3:
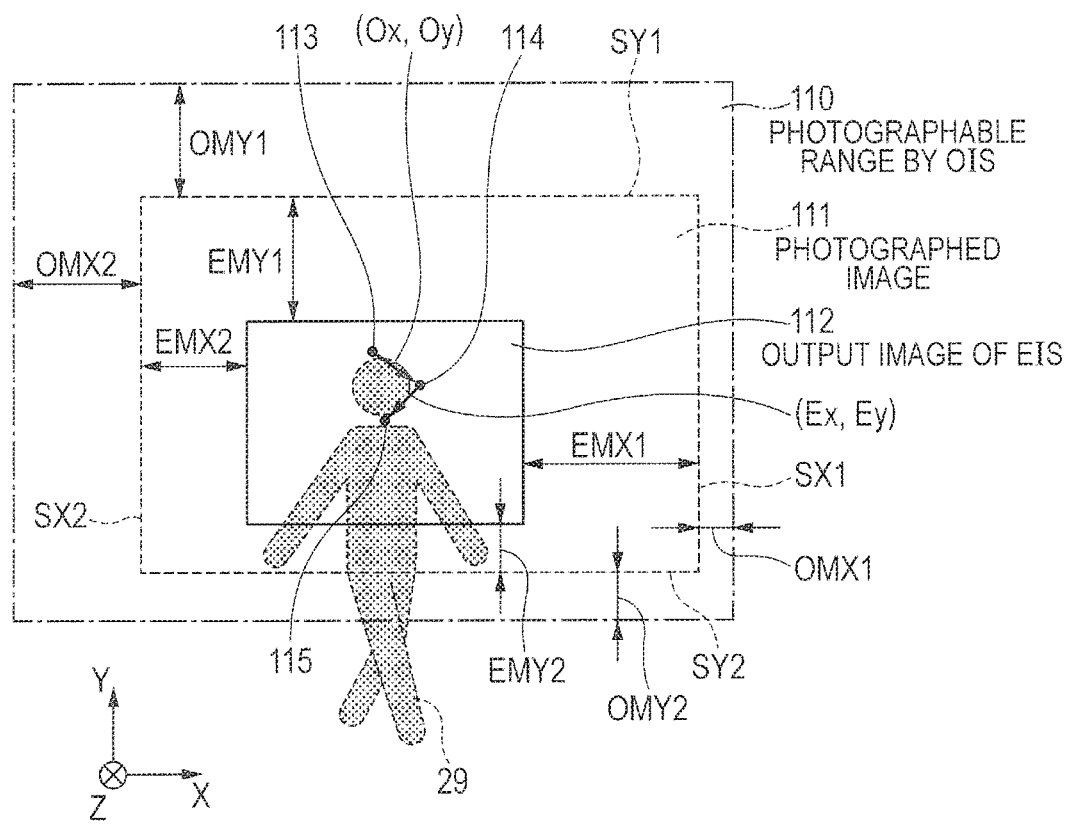
FIG. 3 is a diagram for explaining correction margins of the OIS and the EIS.

FIG. 3 is a diagram for explaining the correction margin of the OIS and the EIS. In FIG. 3, a photographed image 111 photographed by the photographing element is illustrated with a dotted line. The photographed image 111 has a rectangular form defined by four sides SX1, SX2, SY1, and SY2, and corresponds to a light receiving surface (that is, the maximum pixel region to be photographed) of the imaging element. The sides SX1 and SX2 correspond to the rows of the imaging element 50 of the sides SX1 and SX2, while the sides SY1 and SY2 correspond to the columns of the imaging element 50.

A photographable range 110 of the imaging element 50 which is illustrated with a dashed line in FIG. 3 is determined to correspond to a mechanically shiftable range of the correction lens 55. The photographable range 110 has a rectangular form separated by spaces OMX1, OMX2, OMY1, and OMY2 from the sides SX1, SX2, SY1, and SY2 as the outer periphery of the photographed image 111. These spaces OMX1, OMX2, OMY1, and OMY2 correspond to operation margins as spaces from the present position to the shiftable limit of the correction lens 55. In this specification, the spaces OMX1, OMX2, OMY1, and OMY2 are referred to as correction margins of the OIS.

For example, if the correction lens 55 explained in FIG. 2 can be driven in a ±X direction and a ±Y direction of FIG. 3, the operation margin (that is, a distance from the present position to a shiftable limit) of the correction lens 55 in the ±X direction corresponds to the correction margin OMX1 on the right end of FIG. 3. Similarly, the operation margin of the correction lens 55 in the −X direction corresponds to the correction margin OMX2 on the left end of FIG. 3. The operation margin of the correction lens 55 in the +Y direction corresponds to the correction margin OMY1 on the right end of FIG. 3. The correction lens 55 in the −Y direction corresponds to the correction margin OMY2 on the lower end of FIG. 3.

In the initial state (that is, a state without camera shake), the photographed image 111 is positioned in the center of the photographable range 110. In this case, the correction margin OMX1 is equal to the correction margin OMX2, while the correction margin OMY1 is equal to the correction margin OMY2.

The EIS is a system for calculating and correcting a moving amount of a photographic object 29 due to camera shake, by reading the photographed image temporarily in the buffer memory and comparing images photographed at a plurality of points. To eliminate the deviation of the composition, the image range needs to be moved. Thus, a resultant range excluding a correction spare region from the photographed image 111 becomes an output image 112 to be output in fact.

As illustrated in FIG. 3, the output image 112 has a rectangular form separated by spaces EMX1, EMX2, EMY1, and EMY2 from the sides SX1, SX2, SY1, and SY2 as the outer periphery of the photographed image 111. In this specification, the spaces EMX1, EMX2, EMY1, and EMY2 are referred to as correction margins of the EIS. The correction margins EMX1, EMX2, EMY1, and EMY2 are determined in accordance with the position of the output image 112 corresponding to the photographed image 111. In the initial state (that is, a state without camera shake), the output image 112 is positioned in the center of the photographed image 111. In this case, the correction margin EMX1 is equal to the correction margin EMX2, while the correction margin EMY1 is equal to the correction margin EMY2.

The displacement amount of a center 114 in the photographed image 111 relative to a center 113 of the photographable range 110 can be used as an amount corresponding to the shift amount of the correction lens 55. Specifically, if the center 113 of the photographable range 110 is assumed as the origin of the coordinates, position coordinates (Ox, Oy) of the center 114 of the photographable image 111 correspond to the shift amount of the correction lens 55. In the initial state (that is, a state without camera shake), Ox=Oy=0. The variation range of the position coordinates (Ox, Oy) is determined in accordance with the shiftable range of the correction lens 55. In this specification, the variation range of the position coordinates (Ox, Oy) is referred to as a correction range of the OIS.

It is possible to use position coordinates (Ex, Ey) of a center 115 of the output image 112, when the center 114 of the photographed image 111 is assumed as the origin of the coordinates, as position information of the output image 112 corresponding to the photographed image 111. In the initial state (that is, a state without camera shake), Ex=Ey=0. The variation range of the position coordinates (Ex, Ey) is determined in accordance with the ratio of the output image 112 to the photographed image 111. In this specification, the variation range of the position coordinates (Ex, Ey) is referred to as the correction range of the EIS.

Because the photographed image 111 corresponds to the light receiving surface of the imaging element 50, it is possible to represent the correction margins OMX1, OMX2, OMY1, and OMY2 of the OIS, the correction margins EMX1, EMX2, EMY1, and EMY2 of the EIS, and values of the position coordinates (Ox, Oy) and (Ex, Ey), in the unit of pixels. Because the photographed image 111 corresponds to the viewing angle, the correction margins and the values of the coordinates can be represented in the unit of angles. Further, the above-described correction margins and the position coordinates can be represented with the number of bits at the time of AD-converting a position detection signal read by the position detection sensor 47 using an ADC (Analog-to-Digital Converter).

Specifically, let it be assumed that the number of pixels of the imaging element is 13 M pixels (4200 pixels in the horizontal direction and 3120 pixels in the vertical direction). The focal distance of the optical system is 28 mm at the conversion of 35 mm, the diagonal viewing angle is 75°, the horizontal viewing angle is 65°, and the vertical viewing angle is 48°. In this case, one degree of the vertical viewing angle and the horizontal viewing angle approximately corresponds to 65 pixels. If the reading of the Hall sensor is performed by the ADC of 12 bits, 1° of the vertical viewing angle and the horizontal viewing angle is equivalent to approximately 1000 LSB in a read signal.

Whether the finally obtained amount of camera shake correction is expressed as a shift amount in a plane or as an angle is determined in accordance with an optical camera shake correction mechanism incorporated in the camera module 31. Descriptions will hereinafter be made to a case in which the amount of camera shake correction is expressed in the form of a linear shift amount or expressed in the form of a shift angle, and do not intended to limit either one thereof. The technique of this disclosure is applicable to the case with any of the expressions.

For the sake of simplicity, the number of pixels as the shift amount in the plane and the angle as the shift amount on a spherical surface linearly correspond to each other, at least in an approximate manner. Those skilled in the art would easily and accurately associate both of them with each other.

[Operation of Correction Lens Position Control Unit]

Descriptions will now specifically be made to an operation of the correction lens position control unit included in the OIS module 40.

Figure 4:
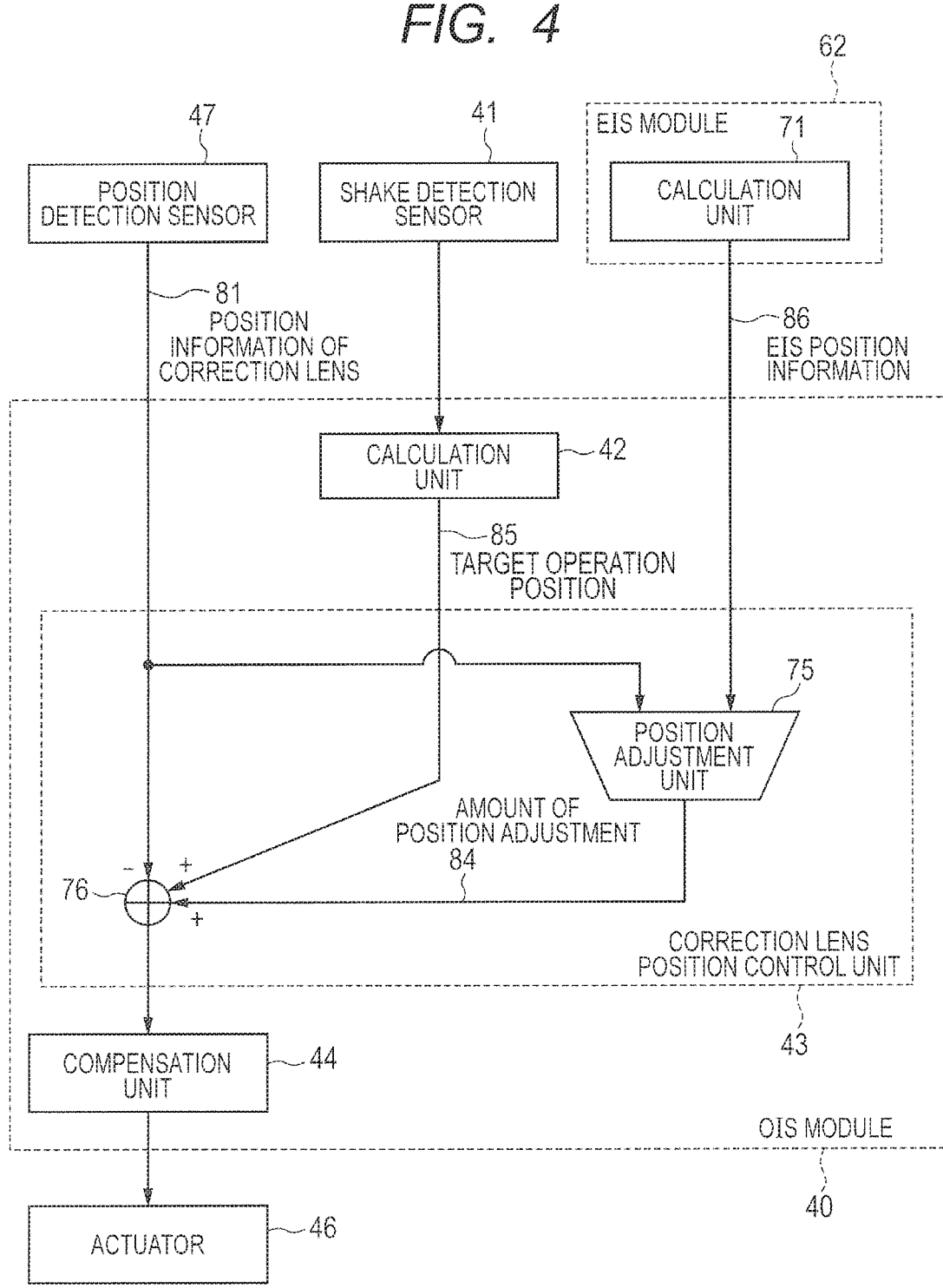
FIG. 4 is a block diagram illustrating a configuration example of a correction lens position control unit of FIG. 1.

FIG. 4 is a block diagram illustrating a configuration example of the correction lens position control unit of FIG. 1. FIG. 4 illustrates also the peripheral elements of the correction lens position control unit 43. With reference to FIG. 4, the correction lens position control unit 43 includes a position adjustment unit 75 and an adder unit 76.

The position adjustment unit 75 acquires position information 81 of the correction lens 55 from the position detection sensor 47, and acquires EIS position information 86 from the calculation unit 71 of the EIS module 62. In this case, the EIS position information 86 may represent the correction margins EMX1, EMX2, EMY1, and EMY2 of the EIS described in FIG. 3, or may represent the displacement amount (Ex, Ey) of the center 115 of the output image 112 relative to the center 114 of the photographed image 111.

The position adjustment unit 75 determines whether the operation position of the correction lens 55 should be changed in order to keep the correction margins of the OIS and the EIS, based on the acquired position information 81 of the correction lens 55 and the EIS position information 86.

In the related art, adjustment of the operation position of the correction lens 55 has been performed based only on the operation margin between the present position of the correction lens 55 and the operation limit. This results in preventing the image distortion generated at the time the correction lens 55 reaches a mechanical end. When the correction lens 55 reaches the mechanical end, the photographed image is further distorted that it cannot be repaired, because the camera shake correction at a high frequency (for example, 30 Hz or greater) is not performed by the OIS, and an unintentional distortion component is generated due to rebound of the correction on the mechanical end.

In this embodiment, the operation position of the correction lens 55 is adjusted in consideration of not only the operation margin of the correction lens 55 but also the correction margin of the EIS. Even if the operation margin of the correction lens 55 is sufficient and equal to or greater than a threshold value, and when any of the EIS correction margins EMX1, EMX2, EMY1, and EMY2 is smaller than the threshold value, the position of the correction lens 55 is adjusted in a manner that any of the EIS correction margins is equal to or greater than the threshold value (will specifically be described later). The cooperative control of the OIS and the EIS is one feature point of the OIS module 40.

When it is determined to perform adjustment of the operation position of the correction lens 55, the position adjustment unit 75 determines an appropriate operation position of the correction lens (as will specifically be described later), based on the position information 81 of the correction lens 55 and the EIS position information 86. Then, the position adjustment unit 75 obtains a position adjustment amount 84 from the present operation position of the correction lens 55 to the appropriate operation position, and outputs the obtained position adjustment amount 84. When the position adjustment of the correction lens 55 is not performed, the position adjustment amount 84 is "0".

When the position adjustment of the correction lens 55 is not performed (when the position adjustment amount 84 is "0"), the adder unit 76 calculates a deviation between a target operation position 85 of the correction lens 55 calculated by the calculation unit 42 of the OIS module 40 and the present operation position of the correction lens 55 based on a detection value of the position detection sensor 47, and outputs the calculated deviation to the compensation unit 44. The compensation unit 44 generates a control signal of the actuator 46 based on the deviation output from the adder unit 76. As a result, the present operation position of the correction lens 55 is feedback-controlled to coincide with the target operation position.

When to perform the position adjustment of the correction lens 55, the adder unit 76 changes the target operation position, by adding the position adjustment amount 84 to the target operation position of the correction lens 55. The adder unit 76 calculates a deviation between the changed target operation position and the present operation position of the correction lens 55, and outputs the calculated deviation to the compensation unit 44. The compensation unit 44 generates a control signal of the actuator 46 based on the deviation output from the adder unit 76. As a result, the present operation position of the correction lens 55 is feedback-controlled to coincide with the target operation position.

[Position Adjustment Method for Correction Lens]

Descriptions will now more specifically be made to a position adjustment method for the correction lens. Descriptions will now be made to the entire operation by describing the specific example of the position adjustment of the correction lens. Then, descriptions will be made to a flowchart illustrating an operation of the correction lens position control unit 43. Finally, descriptions will more specifically be made to operations of Step S210 and S211 of this flowchart.

(1. Specific Example of Position Adjustment of Correction Lens)

Figure 5:
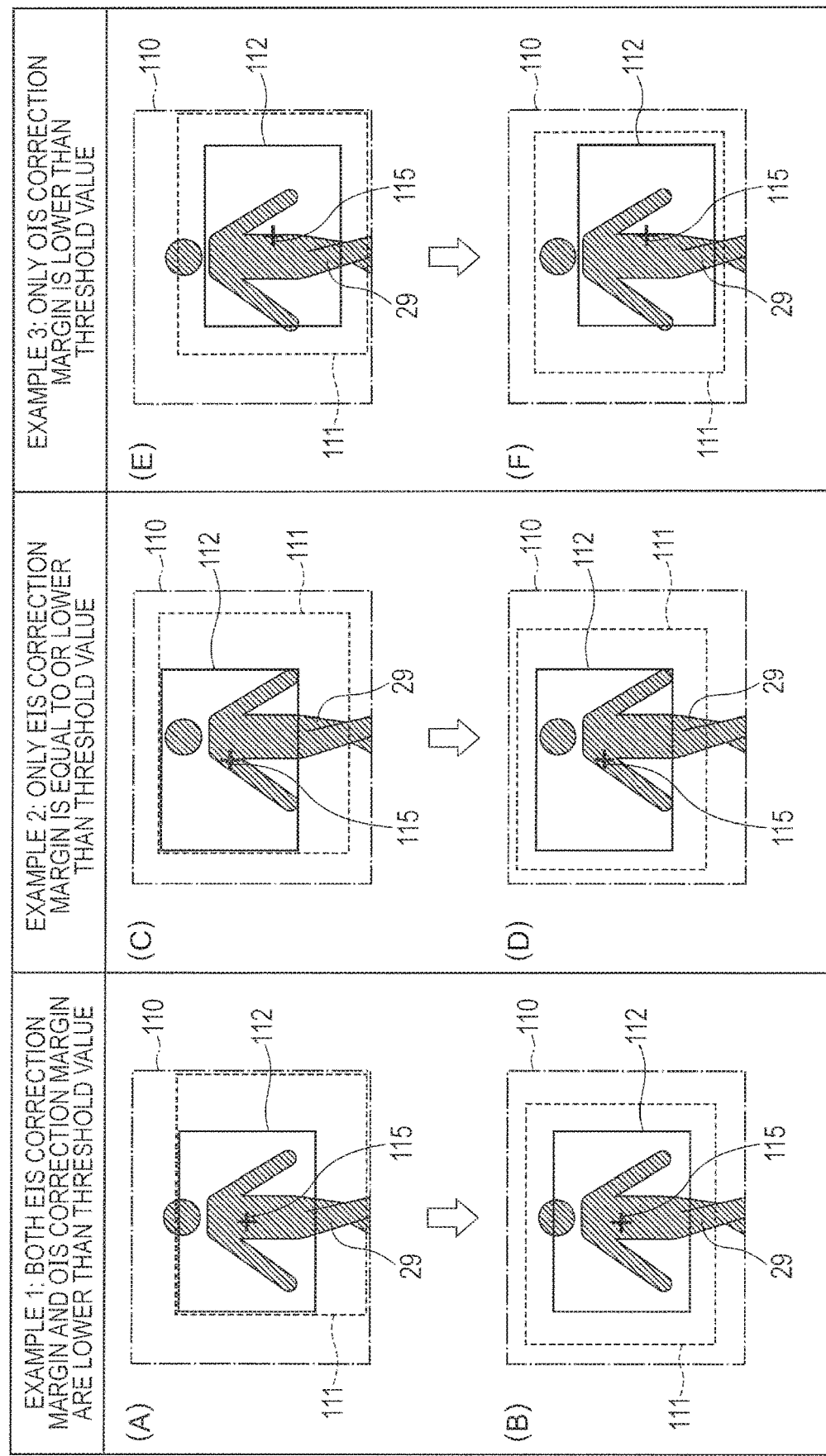
FIG. 5 is a diagram for explaining a specific example of position adjustment for the correction lens, based on the correction margins of the OIS and the EIS.

FIG. 5 is a diagram for explaining a specific example of position adjustment of the correction lens in accordance with the correction margins of the OIS and EIS. FIG. 5A to FIG. 5E illustrate the photographable range 110, the photographed image 111, and the output image 112 explained in FIG. 3.

In Example 1 of FIG. 5A, for the OIS, the correction margin OMX1 on the right end and the correction margin OMY2 on the lower end are smaller than a threshold value. This implies that the correction lens 55 of FIG. 2 is positioned in the vicinity of the lower right mechanical end. For the EIS, the correction margin EMX2 on the left end and the correction margin EMY1 on the upper end are smaller than a threshold value. That is, the output image 112 is arranged in a position adjacent to the upper left corner of the photographed image 111.

In Example 1, as illustrated in FIG. 5B, the correction lens 55 is shifted into the upper left direction. This results in adjusting the position of the photographed image 111 to the upper left side in the photographable range 110. Then, the EIS adjusts the position of the output image 112 for the photographed image 111 without changing in the composition of the screen. Thus, the position of the output image 112 is changed into the center side of the photographed image 111.

In this manner, in the case of FIG. 5A and FIG. 5B, the operation position of the correction lens 55 and the position of the output image 112 by the EIS are mutually adjusted. This results in that the correction margins of the OIS and the EIS are kept in values equal to or greater than a threshold value.

In Example 2 illustrated in FIG. 5C, a sufficient value is kept for each of the correction margins of the OIS. This implies that the correction lens 55 of FIG. 2 is positioned adjacent to the center of the shiftable range. On the other hand, for the EIS, the correction margin EMX2 on the left end and the correction margin EMY1 on the upper end are smaller than a threshold value. That is, the output image 112 is arranged in a position adjacent to the upper left corner of the photographed image 111.

In Example 2, as illustrated in FIG. 5D, the correction lens 55 is shifted into the upper left direction. This results in adjusting the position of the photographed image 111 to the upper left side from the present position in the photographable range 110, in a range where the OIS correction margins OMX2 and OMY1 on the left end and the upper end are not smaller than a threshold value. Then, the EIS adjusts the position of the output image 112 with respect to the photographed image 111, without changing in the composition of the screen. Thus, the position of the output image 112 is changed into the center side of the photographed image 111.

In this manner, in FIG. 5C and FIG. 5D, to keep the correction margin of the EIS, the position of the correction lens 55 is adjusted in a range where the OIS correction margins OMX2 and OMY1 of the left end the upper end are not smaller than a threshold value.

In Example 3 illustrated in FIG. 5E, for the OIS, the correction margin OMX1 on the right end and the correction margin OMY2 on the lower end are smaller than a threshold value. This implies that the correction lens 55 of FIG. 2 is positioned in the vicinity of the lower right mechanical end. A sufficient value is kept also for each of the correction margins of the EIS. That is, the output image 112 is positioned near the center of the photographed image 111.

In Example 3, as illustrated in FIG. 5F, the correction lens 55 is shifted into the upper left direction. As a result, the position of the photographed image 111 is adjusted near the center of the photographable range 110. Then, the EIS adjusts the position of the output image 112 with respect to the photographed image 111 without changing the composition of the screen. Thus, the position of the output image 112 is changed to the position on the lower right side of the photographed image 111. In this case, it is necessary to adjust the shift amount of the correction lens 55, in a manner that the correction margins EMX1 and EMY2 of the EIS on the right end and the lower end do not become smaller than a threshold value.

In this manner, in the case of FIG. 5E and FIG. 5F, to keep the correction margin of the OIS, the position of the correction lens 55 is adjusted in a range where the correction margins EMX1 and EMY2 of the EIS on the right end and on the lower end do not become smaller than a threshold value.

(2. Flowchart Illustrating Operation of Correction Lens Position Control Unit)

Figure 6:
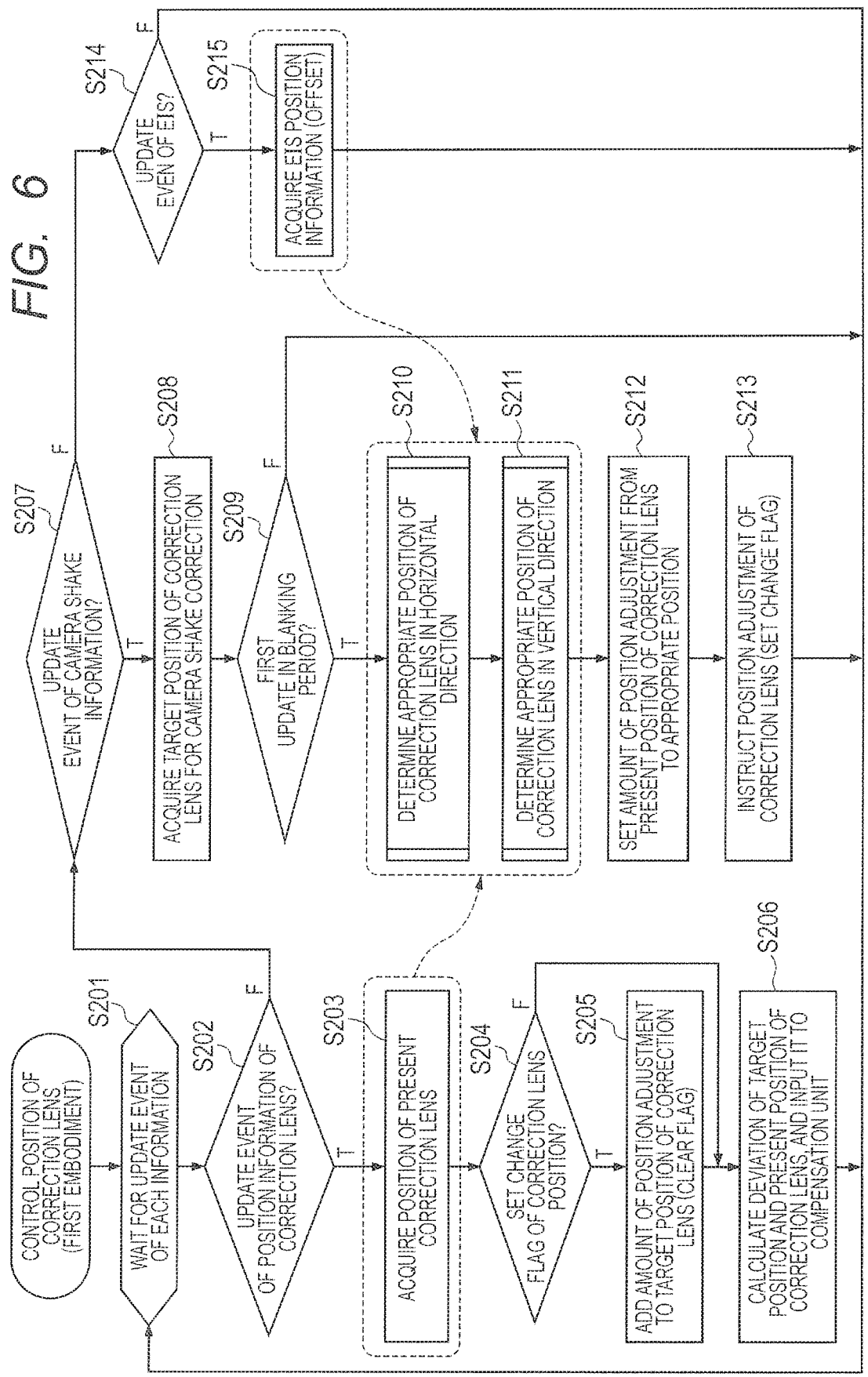
FIG. 6 is a flowchart illustrating an operation of a correction lens position control unit 43 illustrated in FIG. 1.

FIG. 6 is a flowchart illustrating an operation of the correction lens position control unit 43 illustrated in FIG. 1. In a control procedure illustrated in FIG. 6, the position adjustment of the correction lens is performed in a relatively short period within a blanking period between the exposure periods.

With reference to FIG. 1 and FIG. 6, in Step S201, the correction lens position control unit 43 waits for updating of output information from the position detection sensor 47, such as a Hall sensor, updating of output information from the shake detection sensor 41, such as a gyro sensor, or updating of the position of an output image by the EIS.

The update frequency of the output signal of the position detector sensor 47, such as a Hall sensor, is, for example, 20 KHz (update cycle is 50 μsec). The update frequency of the output signal of the shake detection sensor 41, such as gyro sensor, is, for example, 1 KHz (update cycle is 1 msec). In this manner, the frequency of updating the position information of the correction lens is greater by one digit or more than the frequency of detecting the camera shake. The update frequency of the output image of the EIS is equal to the frame frequency. For example, when the number of frames per second is 30 fps, the update frequency of the output image of the EIS is 30 Hz (update cycle is 33.3 msec).

In Step S202, let it be assumed that the output from the position detection sensor 47 is updated, that is, the position information of the correction lens 55 is updated ("TRUE" in Step S202). In this case, in Step S203, the correction lens position control unit 43 acquires the present position information of the correction lens.

In Step S204, the correction lens position control unit 43 determines whether a change flag representing execution of the position adjustment of the correction lens 55 is set. As will be described later, the change flag is set, when the output of the shake detection sensor 41 is first updated in the blanking period ("TRUE" in Step S209).

When the change flag is set ("TRUE" in Step S204), the correction lens position control unit 43 changes the target operation position, by adding the position adjustment amount to the target operation position of the correction lens 55 which is calculated in accordance with the camera shake amount (Step S205). After this, the change flag is cleared. When no change flag is set, the target position operation position of the correction lens 55 is not changed, and remains as the value calculated in accordance with the camera shake amount.

In Step S206, the correction lens position control unit 43 calculates a deviation between the target operation position and the present position of the current lens 55, and inputs this deviation to the compensation unit 44. As a result, the operation position of the correction lens 55 is controlled to cancel the effect of camera shake. Further, the position adjustment of the correction lens is executed in a relatively short period in the blanking period between the exposure periods. After this, the process returns to Step S201.

Let it be assumed that the output from the shake detection sensor 41, such as gyro sensor, is updated, that is, the camera shake information is updated ("FALSE" in Step S202, "TRUE" in Step S207). In this case, in Step S208, the correction lens position control unit 43 acquires a target operation position of the correction lens 55 which is calculated in accordance with the detected camera shake amount.

In Step S209, the correction lens position control unit 43 determines whether the camera shake information is updated first in the blanking period, based on whether the input of the imaging timing signal 80, such as a vertical synchronization signal Vsync, is received. When the camera shake information is not updated first in the blanking period ("FALSE" in Step S209), it returns to the state of waiting for an event input of updating the information (Step S201).

When the camera shake information is first updated in the blanking period ("TRUE" in Step S209), the position adjustment amount is set in the following Steps S210 to S212.

As schematically described in FIG. 5, when it is judged that it is necessary to adjust the position of the correction lens in a horizontal direction, based on the position information 81 of the correction lens 55 and the EIS position information 86, the correction lens position control unit 43 determines an appropriate position of the correction lens 55 in the horizontal direction (Step S210). Similarly, when it is judged that it is necessary to adjust the position of the correction lens in a vertical direction, based on the position information 81 of the correction lens 55 and the EIS position information 86, the correction lens position control unit 43 determines an appropriate position of the correction lens 55 in the vertical direction (Step S211).

In Step S210 and Step S211, it is assumed that the actuator 46 can drive the correction lens 55 in a vertical direction (Y direction) and in a horizontal direction (X direction). Details of Step S210 will be described later with reference to FIG. 7 and FIG. 8. Details of Step S211 will be described later with reference to FIG. 9 and FIG. 10.

In Step S212, the correction lens position control unit 43 obtains a position adjustment amount from the present operation position of the correction lens 55 to its appropriate position. When it is judged that it is not necessary to adjust the position in the X direction in Step S210, a component of the position adjustment amount in the X direction is "0". Similarly, when it is judged that it is not necessary to adjust the position in the Y direction in Step S211, a component of the position adjust amount in the Y direction is "0".

In Step S213, the correction lens position control unit 43 sets a change flag for instructing position adjustment of the correction lens 55. After this, the process returns to Step S201.

Now, it is assumed that the position information of an output image by the EIS is updated ("FALSE" in Step S202, "FALSE" in Step S207, "TRUE" in Step S214). In this case, in Step S215, the correction lens position control unit 43 acquires the EIS position information 86 (that is, information representing the position of the EIS output image 112 relative to the photographed image 111). The EIS position information 86 is used for determining the appropriate position of the correction lens in Step S210 and Step S211. After this, the process returns to Step S201.

(3. Determine Appropriate Position in Horizontal Direction in Step S210 of FIG. 6)

Descriptions will now be made to a method for determining an appropriate position of the correction lens 55 in a horizontal direction in Step S210 of FIG. 6. The following descriptions will be made with some specific numerical examples. However, this embodiment is not limited to the numerical examples, and can easily be generalized.

The following specific examples use the OIS correction margins OMX1, OMX2, OMY1, and OMY2 described in FIG. 3, the EIS correction margins EMX1, EMX2, EMY1, and EMY2, the position coordinates (Ox, Oy) in the center of the photographed image 111 relative to the center of the photographable range 110, and also position coordinates (Ex, Ey) in the center of the output image 112 relative to the center of the photographed image 111. As described above, the OIS margins correspond to the operation margins as the spaces, from the present operation position of the shiftable object (the correction lens) to the operation limit. The position coordinates (Ox, Oy) in the center of the photographed image 111 relative to the center of the photographable range 110 correspond to the present operation position of the shiftable object, such as the correction lens. The value of the correction margin and the position coordinates is represented in the unit of angles, based on the viewing angle.

Figure 7:
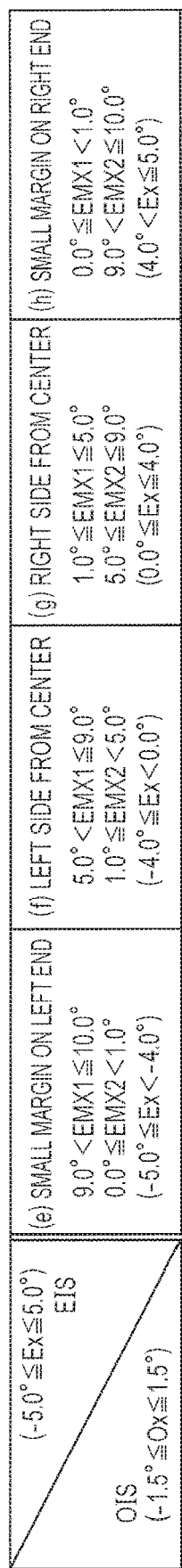
FIG. 7 is a diagram illustrating a position adjustment method in a horizontal direction of the correction lens, in a tabular form.

FIG. 7 is a diagram illustrating a position adjustment method of the correction lens in a horizontal direction.

With reference to FIG. 3 and FIG. 7, the correction range of the OIS in the horizontal direction is $-1.5° \leq Ox \leq 1.5°$, and the correction range of the EIS in a horizontal direction is $-5.0° \leq Ex \leq 5.0$.

The correction range of the OIS in the specific example of FIG. 7 is divided into four regions (a) $-1.5° \leq Ox < 1.0°$, (b) $-1.0° \leq Ox < 0.0°$, (c) $0.0° \leq Ox \leq 1.0°$, and (d) $1.0° < Ox \leq 1.5°$. The above expression (a) corresponds to a case in which the correction margin OMX2 on the left end is smaller than a threshold value (0.5°), that is, it is equivalent to $0.0° \leq OMX2 < 0.5°$. The above expression (b) corresponds to a case in which the correction margin OMX2 on the left end is equal to or greater than the threshold value (0.5°) and in which the photographed image 111 is on the left side from the center of the photographable range 110, that is, it is equivalent to $0.5°≤OMX2<1.5°$. The above expression (c) corresponds to a case in which the correction margin OMX1 on the right end is equal to or greater than the threshold value (0.5°) and in which the photographed image 111 is on the right side from the center of the photographable range 110, that is, it is equivalent to $0.5°≤OMX1≤1.5°$. The above expression (d) corresponds to a case in which the correction margin OMX1 on the right end is smaller than the threshold value (0.5°), that is, it is equivalent to $0.0°≤OMX1<0.5°$.

The correction range of the EIS in the specific example of FIG. 7 is divided into four regions (e) $-5.0°≤Ex<-4.0°$, (f) $-4.0°≤Ex<0.0°$, (g) $0.0°≤Ex≤4.0°$, and (h) $4.0°<Ex≤5.0°$. The above expression (e) corresponds to a case in which the correction margin EMX2 on the left end is smaller than a threshold value (1.0°), that is, it is equivalent to $0.0°≤EMX2<1.0°$. The above expression (f) corresponds to a case in which the correction margin EMX2 on the left end is equal to or greater than the threshold value (1.0°) and in which the output image 112 is on the left side from the center of the photographed image 111, that is, it is equivalent to $1.0°≤EMX2<5.0°$. The above expression (g) corresponds to a case in which the correction margin EMX1 on the right end is equal to or greater than the threshold value (1.0°) and in which the output image 112 is on the right side from the center of the photographed image 111, that is, it is equivalent to $1.0°≤EMX1≤5.0°$. The above expression (h) corresponds to a case in which the correction margin EMX1 on the right end is smaller than the threshold value (1.0°), that is, it is equivalent to $0.0°≤EMX1<1.0°$.

Descriptions will now be made to the case (a) in which the OIS correction margin OMX2 on the left end is smaller than the threshold value (0.5°). In this case, in the case (e) in which the EIS correction margin EMX2 on the left end is smaller than the threshold value (1.0°), the correction lens position control unit 43 does not perform position adjustment of the correction lens (that is, the position adjustment amount=0). It is not possible to perform the position adjustment of the correction lens 55, without changing the composition of the output image 112, because both of the OIS correction margin and the EIS correction margin on the same side are smaller than the threshold value.

Descriptions will now be made to the above case (a) and the case (f) in which the EIS correction margin EMX2 on the left end is equal to or greater than the threshold value (1.0°) and in which the output image 112 of the EIS is on the left side from the center of the photographed image 111. In this case, the correction lens position control unit 43 adjusts the correction lens operation position in a manner that the OIS correction margin OMX2 on the left end is equal to or greater than the threshold value (0.5), in a range where the composition of the output image 112 of the EIS is not changed and where the EIS correction margin EMX2 on the left end is not smaller than the threshold value (1.0°). In this case, the appropriate position of the correction lens in the lateral direction is, for example, the center of the shiftable range. At this time, the OIS correction margins OMX1 and OMX2 on the left end and the right end are equal to each other.

Descriptions will now be made to the case (a) and the cases (g) and (h) in which the EIS correction margin EMX2 on the left end is equal to or greater than the threshold (1.0°), and in which the output image 112 of the EIS is on the right side ($0.0°≤Ex≤5.0°$) from the center of the photographed image 111. In this case, even if the correction lens is shifted further to the right as compared to the cases (a) and (f) in a range where the OIS correction margin OMX1 on the right end is not smaller than the threshold value (0.5°), it is possible not to change the composition of the output image 112 of the EIS and it is also possible to prevent that the EIS correction margin EMX2 on the left end is smaller than the threshold value (1.0°). Thus, the appropriate position of the correction lens in the lateral direction is on the right side from the center of the shiftable range. Specifically, the correction lens position control unit 43 sets the operation position corresponding to the position coordinates $Ox=1.0°$ of the center of the photographed image 111 to the appropriate position of the correction lens 55.

Descriptions will now be made to the case (b) in which the OIS correction margin OMX2 on the left end is equal to or greater than the threshold value (0.5°), and in which the photographed image 111 is on the left side from the center of the photographable range 110. In the case (e) where the EIS correction margin EMX2 on the left end is smaller than the threshold value (1.0°), the correction lens position control unit 43 does not perform the position adjustment of the correction lens. When it is intended to enlarge the EIS correction margin EMX2 on the left end, the correction lens 55 needs to be shifted to the left. Then, the OIS correction margin OMX2 on the left side may possibly be smaller than the threshold value (0.5°).

In the case (b), when (f) (g) both of the EIS correction margin EMX2 on the left end and EIS correction margin EMX1 on the right end are equal to or greater than the threshold value (1.0), there is no need to adjust the operation position of the correction lens. Thus, the position adjustment amount of the correction lens is "0".

In the case (b), when (h) the EIS correction margin EMX1 on the right end is smaller than the threshold value (1.0°), it is possible to set the EIS correction margin EMX1 on the right end to be equal to or greater than the threshold value (1.0°), by shifting the correction lens 55 to the right relative to the present operation position in a range where the OIS correction margin OMX1 on the right end is not smaller than the threshold value (0.5°). Specifically, in this case, the appropriate position of the correction lens in the lateral direction is the center of the shiftable range. At this time, the OIS correction margins OMX1 and OMX2 on the left end and the right end are equal to each other.

Descriptions will now be made to the case (c) in which the OIS correction margin OMX1 on the right end is equal to or greater than the threshold value (0.5°), and in which the photographed image 111 is on the right side from the center of the photographable range 110. In the case (e) where the EIS correction margin EMX2 on the left end is smaller than the threshold value (1.0°), it is possible to set the EIS correction margin EMX2 on the left end to be equal to or greater than the threshold value (1.0°), by shifting the correction lens 55 to the left relative to the present operation position in a range where the OIS correction margin OMX2 on the left end is not smaller than the threshold value (0.5°). Specifically, in this case, the appropriate position of the correction lens in the lateral direction is, for example, the center of the shiftable range. At this time, the OIS correction margins OMX1 and OMX2 on the right end and the left end are equal to each other.

In the case (c), when (f) (g) both of the EIS correction margin EMX1 on the right end and the EIS correction margin EMX2 on the left end are equal to or greater than the threshold value (1.0), there is no need to adjust the operation position of the correction lens. Thus, the position adjustment amount of the correction lens is "0".

In the case (c), and when (h) the EIS correction margin EMX1 on the right end is smaller than the threshold value (1.0°), the correction lens position control unit 43 does not perform the position adjustment of the correction lens. When it is intended to enlarge the EIS correction margin EMX1 on the right end, the correction lens 55 needs to the shifted to the right. Then, the OIS correction margin OMX1 on the right side may possibly be smaller than the threshold value (0.5°).

Descriptions will now be made to the case (d) in which the OIS correction margin OMX1 on the right end is smaller than the threshold value (0.5°). In this case, in the case (h) in which the EIS correction margin EMX1 on the right end is smaller than the threshold value (1.0°), the correction lens position control unit 43 does not perform position adjustment of the correction lens (that is, the position adjustment amount=0). It is not possible to perform the position adjustment of the correction lens 55, without changing the composition of the output image 112, because both of the OIS correction margin and the EIS correction margin on the same side are smaller than the threshold value.

Descriptions will now be made to the above case (d) and the case (g) in which the EIS correction margin EMX1 on the right end is equal to or greater than the threshold value (1.0°) and in which the output image 112 of the EIS is on the right side from the center of the photographed image 111. In this case, the correction lens position control unit 43 adjusts the correction lens operation position in a manner that the OIS correction margin OMX1 on the right end is equal to or greater than the threshold value (0.5), in a range where the composition of the output image 112 of the EIS is not changed and where the EIS correction margin EMX1 on the right end is not smaller than the threshold value (1.0°). In this case, the appropriate position of the correction lens in the lateral direction is, for example, the center of the shiftable range. At this time, the OIS correction margins OMX1 and OMX2 on the right end and the left end are equal to each other.

Descriptions will now be made to the case (d) and the cases (e) and (f) in which the EIS correction margin EMX1 on the right end is equal to or greater than the threshold value (1.0°), and in which the output image 112 of the EIS is on the right side (−5.0°≤Ex≤0.0°) from the center of the photographed image 111. In this case, even if the correlation lens is shifted further to the left as compared to the cases (d) and (g) in a range where the OIS correction margin OMX2 on the left end is not smaller than the threshold value (0.5°), it is possible not to change the composition of the output image 112 of the EIS and it is also possible to prevent that the EIS correction margin EMX1 on the right end is smaller than the threshold value (1.0°). Thus, the appropriate position of the correction lens in the lateral direction is on the left side from the center of the shiftable range. Specifically, the correction lens position control unit 43 sets the operation position corresponding to the position coordinates Ox=−1.0° of the center of the photographed image 111 to the appropriate position of the correction lens 55.

Figure 8:
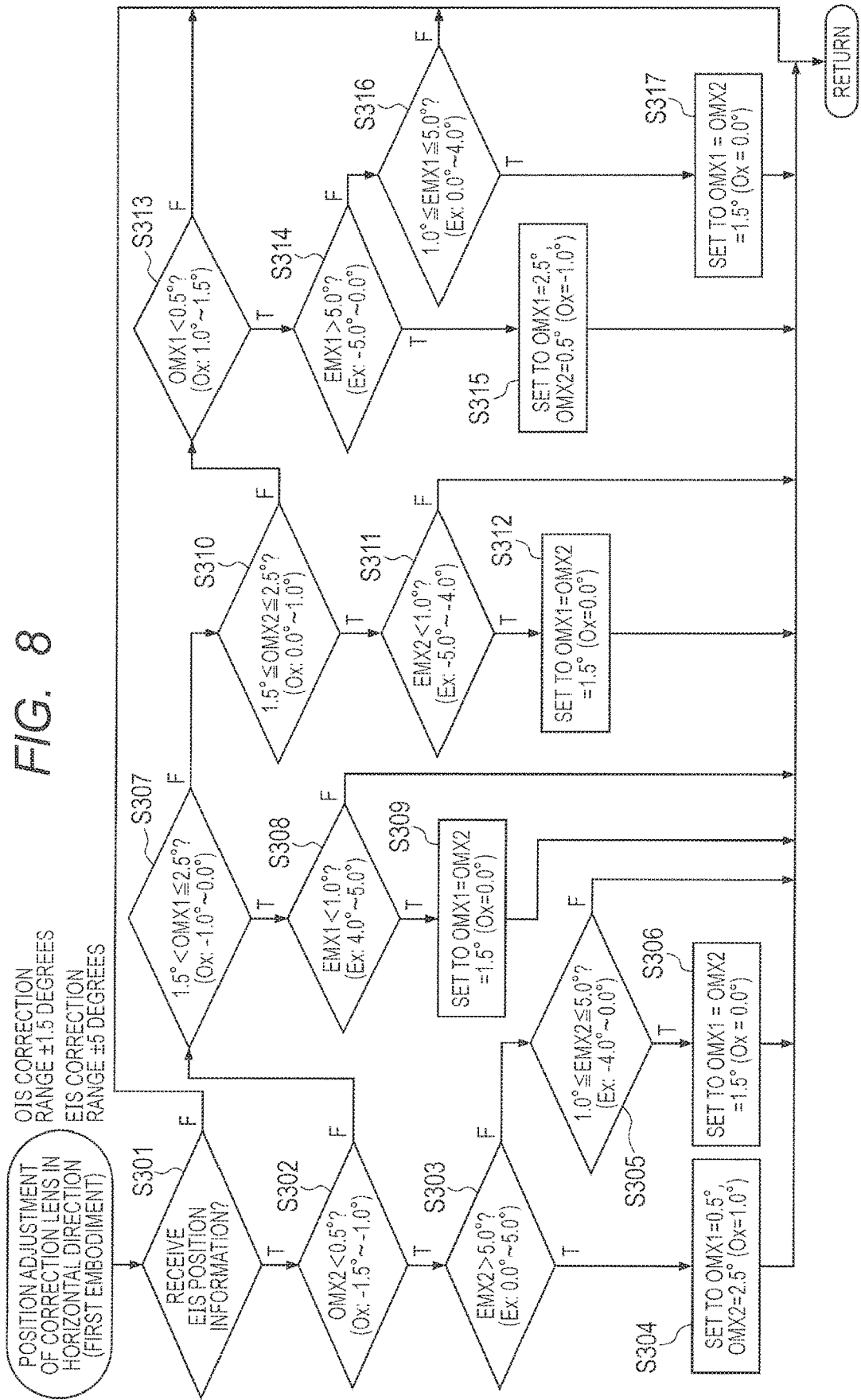
FIG. 8 is a flowchart illustrating a position adjustment procedure in the horizontal direction of the correction lens.

FIG. 8 is a flowchart illustrating a position adjustment procedure in the horizontal direction of the correction lens. The flowchart of FIG. 8 corresponds to the table of FIG. 7, and has the same numeral examples as those of the table of FIG. 7. In the following descriptions, the symbols (a) to (h) are given in association with the table in FIG. 7.

Steps of FIG. 8 are executed, when the EIS position information 86 illustrated in FIG. 1 is received by the correction lens position control unit 43 ("TRUE" in Step S301). The position adjustment procedure is briefly classified into four processes, in association with the operation position of the correction lens 55 (that is, displacement Ox in an X direction of the center of the photographed image 111 relative to the center of the photographable range 110).

(a) When OMX2<0.5° ("TRUE" in Step S302), if EMX2>5.0° ("TRUE" in Step S303, (g) and (h)), OMX2=2.5° is set as the appropriate position (Step S304). When 1.0°≤EMX2≤5.0°("FALSE" in Step S303, "TRUE" in Step S305, (f)), OMX2=1.5° is set as an appropriate position (Step S306). When EMX2<1.0°, the position adjustment of the correction lens is not performed (that is, the position adjustment amount is "0").

(b) When 1.5°<OMX1≤2.5° ("FALSE" in Step S302, "TRUE" in Step S307), EMX1<1.0° ("TRUE" in Step S308, if (h), OMX1=1.5° is set as an appropriate position (Step S309). If EMX1≥1.0°, the position adjustment of the correction lens is not performed.

(c) When 1.5°≤OMX2≤2.5° ("FALSE" in Step S302 and S307, "TRUE" in Step S310), if EMX2<1.0° ("TRUE" in Step S311 (e)), OMX2=1.5° is set as an appropriate position (Step S312). If EMX2≥1.0°, the position adjustment of the correction lens is not performed.

(d) When OMX1<0.5° ("FALSE" in Step S302, S307, and S310, "TRUE" in Step S313), if EMX1>5.0° ("TRUE" in Step S314, (e), (f)), OMX1=2.5° is set as an appropriate position (Step S315). If 1.0≤EMX1≤5.0° ("FALSE" in Step S314, "TRUE" in Step S316, (g)), OMX1=1.5° is set as an appropriate position (Step S317). If EMX2<1.0°, the position adjustment of the correction lens is not performed.

In short, in the case (a), when the OIS correction margin OMX2 on the left side is smaller than a first threshold value (0.5), the correction lens position control unit 43 sets the position adjustment amount to enlarge the OIS correction margin OMX2 on the left side, as long as the EIS correction margin EMX2 on the left side is equal to or greater than a second threshold value (1.0). In this case, as the EIS correction margin EMX2 on the left end is large, the position adjustment amount is set in a manner that the OIS margin OMX2 on the left end is enlarged gradually or continuously. The same applies to the OIS correction margin OMX2 on the right end of the case (d) and the EIS correction margin on the right end.

In short, in the case (c), when the EIS correction margin EMX2 on the left end is smaller than the second threshold value (1.0), and when the OIS correction margin OMX2 on the left end is greater than a third threshold value (1.5) greater than the first threshold value (0.5), the correction lens position control unit 43 sets the position adjustment amount in a manner that the OIS correction margin OMX2 on the left end is decreased. In the case (b), the same applies to the OIS correction margin OMX1 on the right end and the EIS correction margin on the right end.

(4. Determine Appropriate Position in Vertical Direction in Step S211 of FIG. 6)

Figure 10:
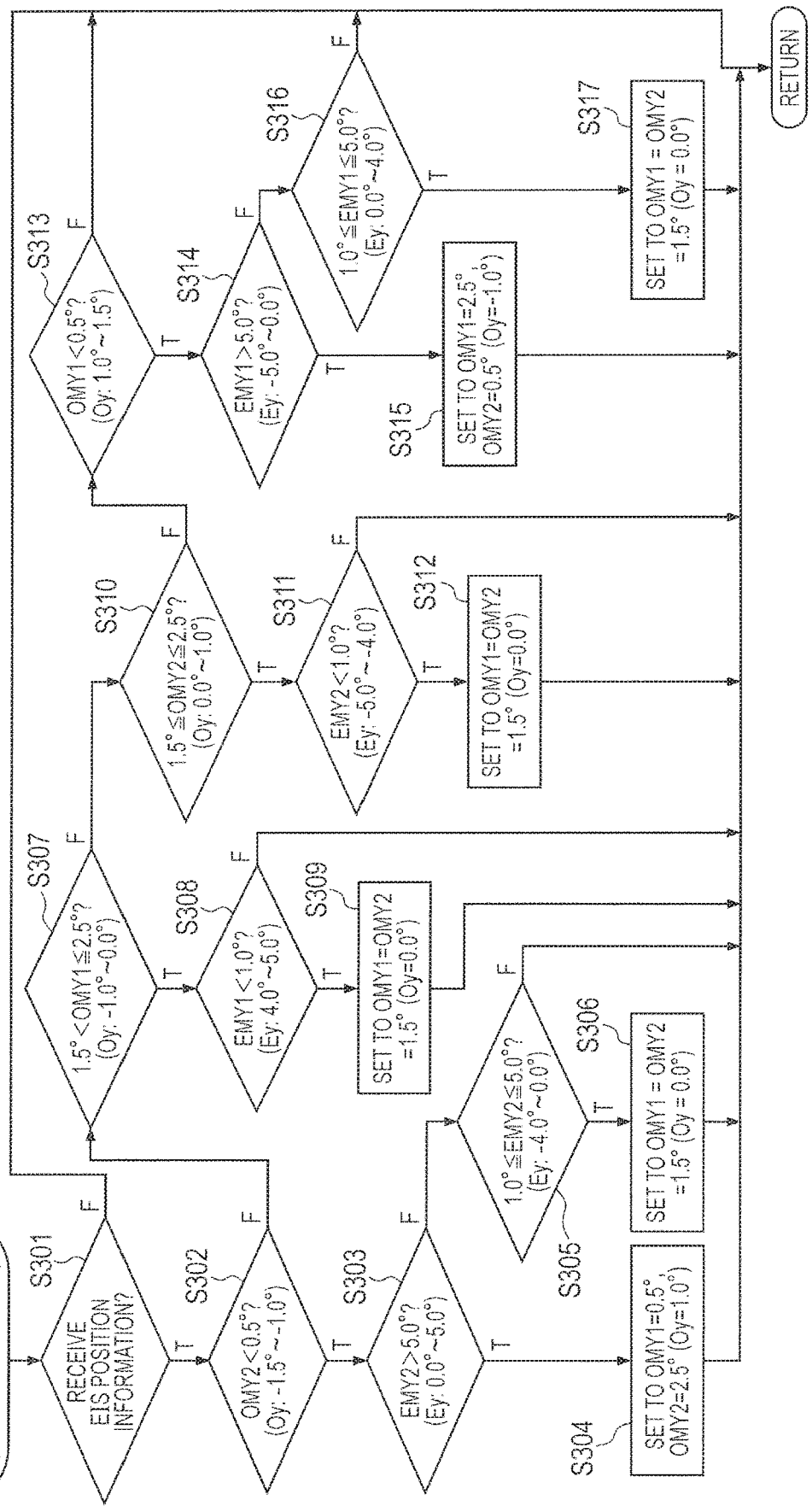
FIG. 10 is a flowchart illustrating a position adjustment procedure in the vertical direction of the correction lens.

FIG. 9 is a diagram illustrating a position adjustment method of the correction lens in a vertical direction in the form of a table. FIG. 10 is a flowchart illustrating a position adjustment procedure of the correction lens in the vertical direction. The table illustrated in FIG. 9 corresponds to the table illustrated in FIG. 7, and the flowchart of FIG. 10 corresponds to the flowchart of FIG. 8. The determination method for the appropriate position in the vertical direction illustrated in FIG. 9 and FIG. 10 is the same as the determination method for the appropriate position in the horizontal direction explained in FIG. 7 and FIG. 8, and thus will not be described over and over.

Specifically, in FIG. 7 and FIG. 8, the horizontal direction is changed to the vertical direction, the OIS correction margin OMX2 on the left end is changed to the OIS correction margin OMY2 on the lower end, the OIS correction margin OMX1 on the right end is changed to the OIS correction margin OMY1 on the upper end, the displacement Ox in the horizontal direction of the center of the photographed image 111 relative to the center of the photographable range 110 is changed to the displacement Oy in the vertical direction. Further, in FIG. 7, the EIS correction margin EMX2 on the left end is changed to the EIS correction margin EMY2 on the lower end, the EIS correction margin EMX1 on the right end is changed to the EIS correction margin EMY1 on the upper end, and the displacement Ex in the horizontal direction of the center of the output image 112 relative to the center of the photographed image 111 is changed to the displacement Ey in the vertical direction. By the above changes, the table of FIG. 9 and the flowchart of FIG. 10 can be obtained.

[Timing Diagram of Camera Shake Correction Process]

Figure 11:
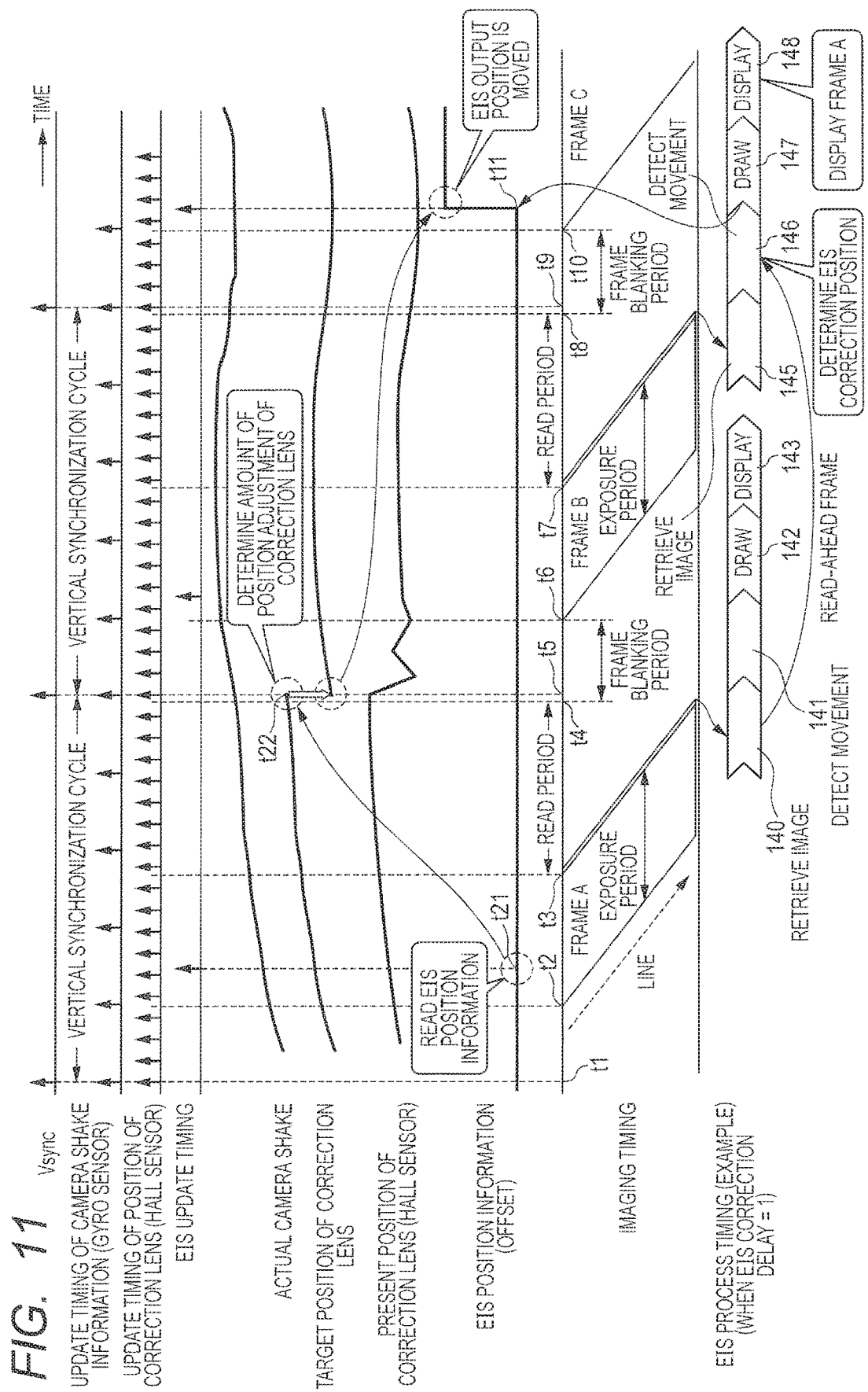
FIG. 11 is a timing diagram of a camera shake correction process in an electronic device of the first embodiment.

FIG. 11 is a timing diagram of a camera shake correction process by the electronic device according to the first embodiment. FIG. 11 illustrates, sequentially from the above, an output timing for a vertical synchronization signal Vsync, an update timing for camera shake information output from the gyro sensor, update timing for position information of the correction lens 55 illustrated from the Hall sensor, and update timing of image correction by the EIS. FIG. 10 sequentially illustrates further an actual camera shake amount, a target position of the correction lens, the position of the correction lens, an offset amount of screen by the EIS, photographing timing, and a process procedure of the EIS. Descriptions will hereinafter be made generally an operation of the correction lens position control unit 43 of FIG. 1.

With reference to FIG. 1 and FIG. 11, the vertical synchronization signal Vsync is output from the imaging element 50 at times t1, t5, and t9 within a frame blanking period. The screen position (offset) is updated by the EIS with the same cycle as a vertical synchronization cycle (may be referred to as a "frame period"). The number of frames per second is, for example, 30 fps. Then, the frequency of the vertical synchronization signal, that is, the update frequency of correction by the EIS is, for example, 30 Hz (the vertical synchronization cycle is 33.3 msec). The exposure period in the case of 30 fps is, for example, approximately 25 sec, and the frame blanking period is approximately 8 msec. The above-described exposure period represents a time period since the start of exposure of the first line until the end of the exposure of the final line.

The update frequency for an output signal of the shake detection sensor 41, such as a gyro sensor, is, for example, 1 KHz (update cycle is 1 msec). The update frequency of an output signal of the position detection sensor 47, such as a Hall sensor, is, for example, 20 KHz (update cycle is 50 μsec). The update timing illustrated in FIG. 11 represents a schematic case, and does not accurately reflect the above cycles.

In the frame A, the first line is exposed from the time t2 to the time t3. Exposure is performed sequentially for the lines, and data of the lines are read out after the exposure. At the time t4, data of the entire lines is completely read (that is, retrieval of the image 140). The frame blanking period begins from the time 4 until the time 6.

At the time t4, if the retrieval of the image 140 for the frame A is completed, the EIS module 62 compares it with image data of a read-ahead frame, thereby detecting movement 141 of the object, and subsequently executing drawing 142 and displaying 143 of the image corrected by the EIS. In this case, the display image is an image of one preceding frame of the frame A.

In the next frame B, the first line is exposed at a time t6 and a time t7. After the exposure, data of the corresponding line is read out. Exposure of the lines is sequentially performed, and data of the entire line is completely read out at a time t8 (that is, retrieval of image 145). The frame blanking period begins from the time t8 until a time t10.

At the time t8, if the retrieval 145 of the image in the frame B is completed, the EIS module 62 compares it with image data of a read-ahead frame A, thereby detecting the movement 141 of the object, and subsequently executing drawing 142 and displaying 143 of an image in the frame A after corrected by the EIS.

At a time t22 in which camera shake information is first updated in the blanking period from the time t4 until the time t6 ("TRUE" in Step S209 of FIG. 6), the correction lens position control unit 43 determines the position adjustment amount of the correction lens, based on the EIS position information 86 read at a time t21 (Step S215) and the operation position of the correction lens read by the Hall sensor (Step S212).

The correction lens position control unit 43 sets a new target operation position by adding the position adjustment amount to the target operation position of the correction lens 55, at a next update timing for position information of the Hall sensor (same as a time t22) (Step 205). The operation position of the correction lens 55 is feedback-controlled based on this new target operation position (Step S206).

As a feature of the first embodiment, the calculated position adjustment amount is entirely added to the target operation position. The target operation position is suddenly changed, and it takes a relatively long settling time for controlling the position of the correction lens 55. Note, however, that the shift of the correction lens 55 does not have an influence on the exposure, as long as the position adjustment of the correction lens 55 is completed in the blanking period. When the settling period is longer than the blanking period due to the larger position adjustment amount than a predetermined upper limit, the position adjustment amount may be divided into a plurality of parts, and the position of the correction lens 55 may be adjusted by a divided part in association with each of a plurality of blanking periods.

The composition of the output image is changed due to the position adjustment of the correction lens 55. This composition change is absorbed by the updating of the output image 112 by the EIS in the next time t11. Thus, as long as the EIS and the OIS are operable, the composition of the output image 112 is not changed.

[Adjustment of Various Parameters]

For the above-described OIS and EIS, it is necessary to appropriately adjust various control parameters. The control parameters to be adjusted include parameters of the memory size of the EIS correction spare region (a part obtained by excluding the output image from the photographed image), parameters of threshold values in the position adjustment procedure explained in FIG. 7 to FIG. 10 and setting values for the appropriate positions of the correction lens, and parameters of a PID compensation unit to be used as the compensation unit 44.

The setting values of the control parameters depend on the operation modes in consideration of the photographer's intention and the level of user skills. For example, in the case of portrait photography using a camera held by a hand, the camera shake amplitude is lower than the case in which a photograph is taken while walking. In the camera photography by experts, the camera shake amount is smaller than that of the photography by beginners. Thus, in the adjustment process as will be described later, each parameter setting value is set in association with the operation mode of the camera. Further, a vibration pattern of a vibratory unit 121 is determined to obtain the reproducibility in association with the operation mode.

Figures 12A, 12B:
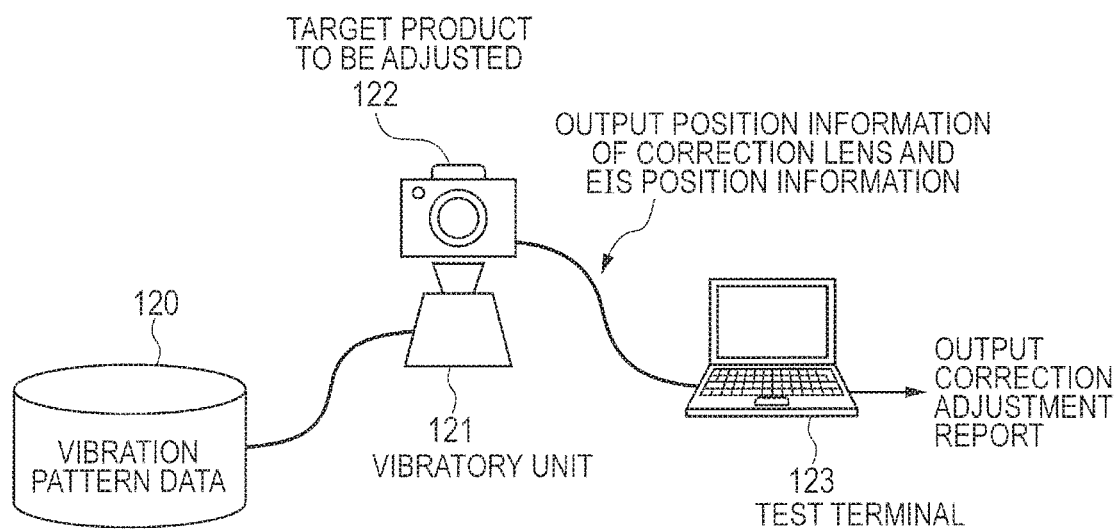
FIGS. 12A and 12B are diagrams for explaining an adjustment method of control parameters.

FIGS. 12A and 12B are diagrams for explaining a method for adjusting the control parameters. With reference to FIG. 12A, a target product 122 to be adjusted is fixed onto a vibratory table of the vibratory unit 121. The vibratory unit 121 vibrates the vibratory table in accordance with vibratory pattern data 120. The OIS module 40 provided for the target product 122 to be adjusted outputs the position information 81 of the correction lens (OIS_X, OIS_Y) and the EIS position information 86 (EIS_X, EIS_Y) to a test terminal 123 as a test control unit, as correction adjustment reports. This test terminal 123 adjusts and sets each control parameter of the target product 122 to an optimum value. At this time, each control parameter is set to reduce the correction spare region necessary for the EIS as much as possible, without departing from the EIS correction range and the OIS correction range.

FIG. 12B is a diagram illustrating an example of a correction adjustment report. FIG. 12B illustrates the position information 81 (OIX_X, OIX_Y) and the EIS position information 86 (EIS_X, EIS_Y), output from the target product 122 to be adjusted, in association with the vertical synchronization cycle (Vsync). When the OIS reaches the correction limit (that is, when it deviates from the correction range), "0" is displayed in the field of the error (ERR). When the EIR reaches the correction limit (that is, when it deviates from the correction range), "E" is displayed in the field of the error (ERR).

Descriptions will now specifically be made to an example of an adjustment procedure. The following adjustment procedure may be manually performed, or may be automatically performed by the test terminal 123.

(1) As the first stage, the adjustment is performed by a single OIS module, and the level of correction by the OIS is checked. Details will be described as follows.

(1.1) The control parameters of the OIS are adjusted, by a single OIS. When the PID compensation unit is used as the compensation unit 44 of the OIS module 40, the parameters (that is, proportional gain, integration gain, differential gain) are temporarily determined.

(1.2) When the electronic device 30A is a Smartphone, the correction range of the OIS is narrow. Thus, a deviation of the correction range cannot be avoided on many vibration conditions (use cases). When the position adjustment method for the correction described in this embodiment is not applied, the number of deviations of the OIS correction range is recorded using the above-described report, in association with the vibration patterns. The OIS correction performance would be prevented from being deteriorated, by the following adjustment.

(2) As the second stage, the initial value of the EIS adjustment range is determined. Details of the procedure will be described as follows.

(2.1) The adjustment is performed by a single EIS module. It is checked whether the deviation of the EIS correction range does not occur, to what extent the correction spare region of the EIS is expanded. The initial value of the correction range of the EIS is determined.

(2.2) In the process of (2.1), the above-described correction adjustment report can be used. While changing the correction range (that is, the percentage of the correction spare region) of the EIS, vibration is applied to the target product 122 to be adjusted, based on the vibration pattern data 120. Then, the vibration result is checked in the form of a correction adjustment report. By repeating the above, the initial value of the EIS correction range is determined.

(2.3) If the EIS adjustment range is 50%, when a deviation of the EIS correction range occurs, the initial value of the EIS correction range is 50%. The following adjustment is performed, without deviating from the correction range of 50%.

(3) As the third stage, the various parameters (threshold values and setting values of the appropriate position) in the position adjustment procedure described in this embodiment are determined. The above-described correction adjustment report is acquired in association with each vibration pattern, and the various parameters are set in order to maximize the EIS correction margin.

(4) As the fourth stage, the EIS correction range is set to a value smaller than the value determined at the above-described second stage. Details of the procedure will be described as follows.

(4.1) When the EIS correction range is further decreased, the above-described correction adjustment report is acquired in association with each vibration pattern. The minimum setting value of the EIS adjustment range is found, without deviating from the EIS correction range.

(4.2) The above process (3) and the process (4.1) will appropriately be repeated.

(4.3) Parameters of the compensation unit 44 of the OIS module 40 are reviewed.

For example, when the PID compensation unit is used as the compensation unit 44, as a result of visible evaluation of the output image, if the drift of the screen is too large by the correction of the OIS, or if it can be judged that the EIS has performed a too large amount of correction on the drift by the OIS, the parameters of the PID compensation unit are adjusted in a manner that elimination of the residual deviation is delayed. When the parameters are changed, the adjustment is started again from the above process (1.2).

(5) As the fifth stage, the OIS correction lens position adjustment value is determined. Different adjustment values are provided in accordance with the vibration patterns. Based on the use of the product and the assumption of the user photography skills, the number of modes for the products is determined, and the adjustment value is selected in association with each mode.

[Display of User Guide on Finder Screen]

When the use ruses the electronic device 30A of this embodiment, it is suggested that a user guide be displayed on a finder screen, in order for the user to perform operations, to intentionally prevent the deviation of the EIS correction range.

Figure 13A:
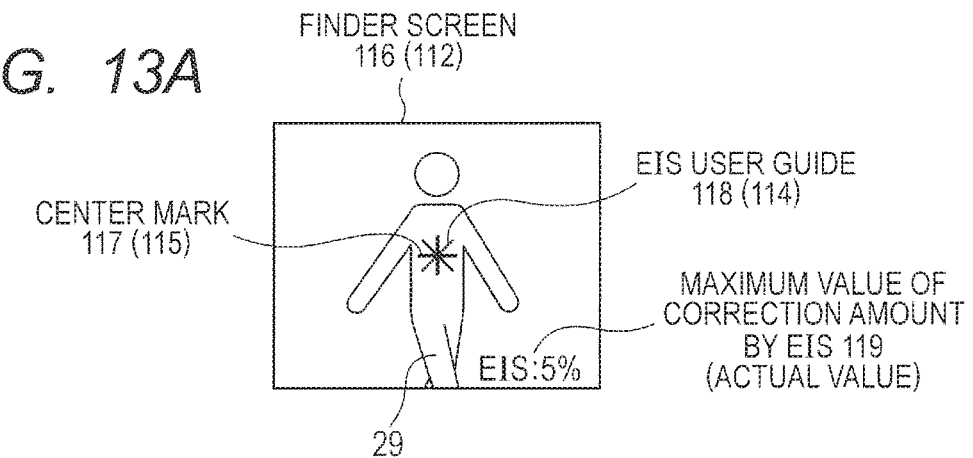
FIG. 13A to 13C are diagrams for explaining a user guide displayed on a finder screen.
Figure 13B:
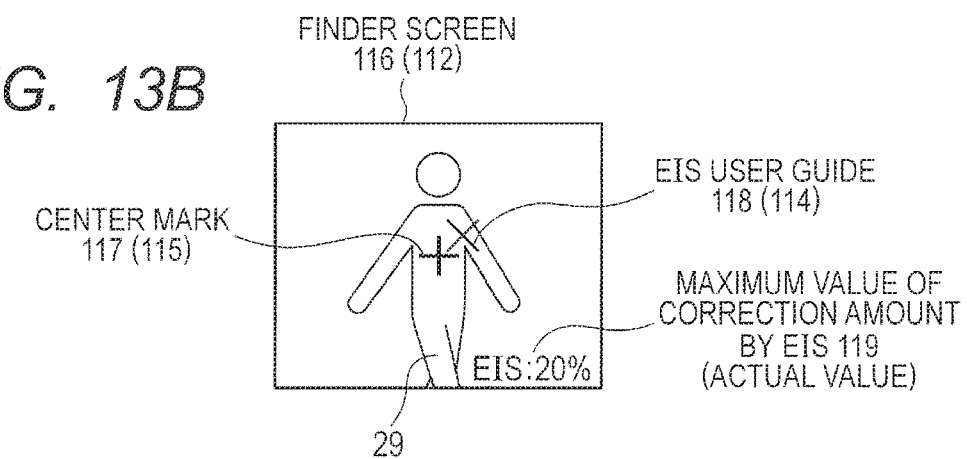
Figure 13C:
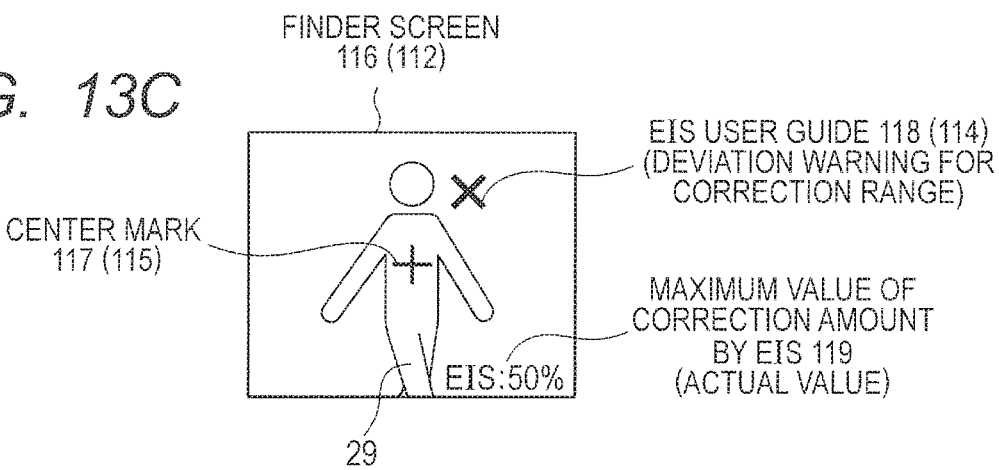

FIGS. 13A to 13C are diagrams for explaining the user guide displayed on the finder screen.

With reference to FIG. 13A, the image display controller 64 displays a photographic object 29, a center mark 117 of the finder, a user guide 118, and a maximum value 119 of an amount of correction by the EIS, on a finder screen 116. The user guide 118 and the maximum value 119 of the amount of correction by the EIS are displayed by the image display controller 64, based on an instruction from the EIS module 62.

The above-described user guide 118 can be generated based on the EIS position information 86. Specifically, the finder screen 116 corresponds to the output image 112 of FIG. 3, the center mark 117 corresponds to the center 115 of the output image 112 of FIG. 3, the user guide 118 corresponds to the center 114 of the photographed image 111 of FIG. 3. In the initial state (a state without camera shake), the user guide 118 coincides with the center mark 117.

With reference to FIG. 13B, due to occurrence of camera shake, the user guide 118 is deviated into an upper right direction of the mark 117, in accordance with a camera shake amount. The user adjusts the position of the camera in a manner that the center mark 117 coincides with the user guide 118, thereby enabling to eliminate the camera shake.

With reference to FIG. 13C, in the deviation of the correction range of the EIS, a display mode of the user guide 188 is changed, thereby giving the user a warning.

According to the above configuration, because the user can intentionally suppress the camera shake using the user guide representing the camera shake circumstances, the image quality can be improved. Because the user can identify the deviation frequency of the EIS correction range and the EIS correction margin, the user can select the percentage of the EIS correction spare range, in accordance with the user photography skills and photographic usage (portrait photography using a camera held by a hand, photography performed while walking). As a result, when the EIS correction range can be reduced, the system resources, such as the memory, the CPU, and the bus band, can be used by other application processes.

Usually, the camera shake due to human use is approximately 10 Hz or lower. The camera shake of a low frequency has a large amplitude, while the camera shake of a high frequency has a small amplitude. The OIS has preferable correction characteristics in a high frequency band, while the EIS has preferable correction characteristics in a low frequency band. As described above, the user guide 118 is displayed on the finder screen 116, thereby enabling to intentionally suppress the camera shake equal to or lower than approximately 1 Hz. As a result, it is possible to reduce the memory consumption for use in the correction range of the EIS.

Effect of First Embodiment

According to this embodiment, the optimum operation position of the correction lens is determined in a manner to enlarge the correction margins of the OIS and EIS as much as possible, based on the operation position information of the correction lens and the position information of an output image of the EIS. Thus, it is possible to provide a control device for the camera module which can continuously execute the OIS and the EIS without changing the composition of the output image of the EIS as much as possible. The operation position of the correction lens is optimized based on the position information of the output image of the EIS, thereby enabling to reduce the memory consumption for the correction range of the EIS, and resulting in reducing the consumption power and the calculation amount.

Particularly, in moving image photography in recent years, with the high resolution processing, such as 4K, it is urgently necessary to reduce the electric power of the camera device. As one measure to reduce the consumption power, it is effective to narrow the correction range of the EIS. According to this embodiment, the OIS and the EIS are continuously executed, thereby enabling to reduce the consumption power without deteriorating the image quality of the output image.

Second Embodiment

In the case of Smartphone, in many cases, the OIS module 40 is incorporated in the camera module 31. Thus, when no change is made in the configuration of the camera module 31 other than the OIS module 40, the OIS module 40 needs to execute the position adjustment of the correction lens 55 without using the imaging timing signal 80, such as a vertical synchronization signal Vsync.

In the second embodiment, descriptions will be made to a case of performing the position adjustment for the correction lens 55 asynchronously with the imaging timing, by dispensing with transmission of the imaging timing signal 80 (for example, vertical synchronization signal Vsync) from the imaging element 50 to the correction lens position control unit 43 of the OIS module 40.

Descriptions will now be made to the correction lens as an example of a movable object for the OIS, in this embodiment. However, this embodiment is applicable to a movable object other than the correction lens, for example, to the OIS with a sensor shift system which shifts an image sensor.

[Entire Configuration of Electronic Device]

Figure 14:
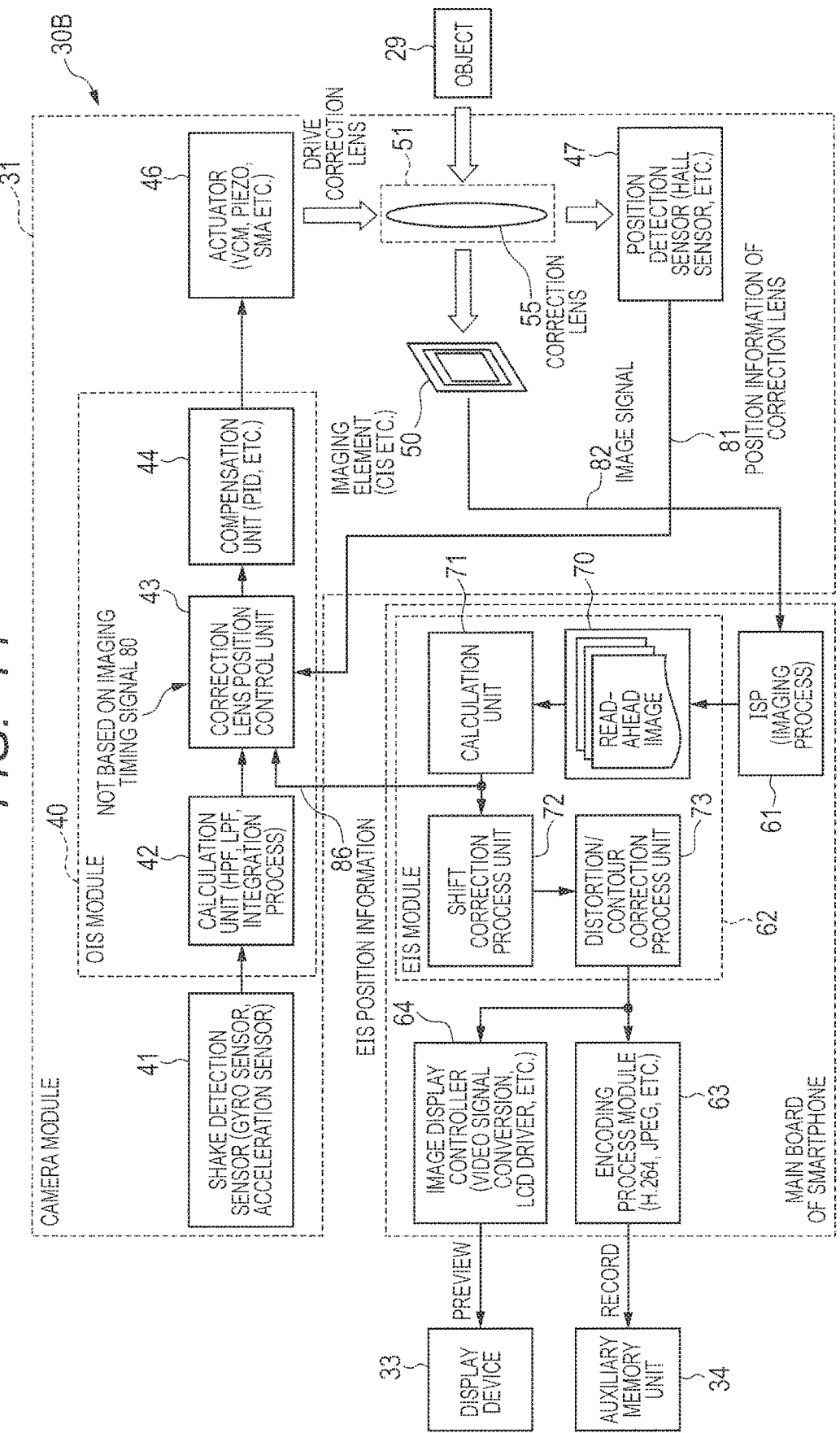
FIG. 14 is a block diagram illustrating a configuration example of an electronic device 30B of a second embodiment.

FIG. 14 is a block diagram illustrating a configuration example of the electronic device 30B of the second embodiment. The block diagram of FIG. 14 corresponds to that of FIG. 1 in the first embodiment.

The electronic device 30B of FIG. 14 differs from the electronic device 30A of FIG. 1, in a point that the imaging timing signal 80 is not transmitted from the imaging element 50 to the correction lens position control unit 43 of the OIS module 40. Thus, the operation of the correction lens position control unit 43 of the OIS module 40 differs from that of the first embodiment. Because any other points of FIG. 14 are the same as those of FIG. 11, the same or corresponding parts are identified by the same reference numerals, and thus will not be described over and over.

[Operation of Correction Lens Position Control Unit 43]

The operation of the correction lens position control unit 43, particularly the operation of the position adjustment unit 75, is the same as that of the first embodiment, until the appropriate position of the correction lens 55 is determined. In the second embodiment, the position adjustment amount from the present position to the appropriate position is divided into a plurality of subquantities in association with each Hall feedback cycle (that is, update cycle of the output from the Hall sensor). A new target operation position is generated by adding each subquantity (referred to as "divided correction amount") to the target operation position based on the camera shake amount, in association with Hall feedback cycle. As a result of this, the camera shake is corrected by the OIS, while the correction lens 55 shifts at a constant speed in a direction of the appropriate position regardless of the imaging timing.

The shift speed of the correction lens 55 depends on the obtained image quality, the number of pixels of the CIS, and the specifications of the optical system. The following cases explained in FIG. 3 will now be examined as some specific numerical examples.

As specifications of the optical system, it is assumed that the focal distance of the optical system is 28 mm in 35 mm conversion. In this case, the diagonal viewing angle is 75°, the horizontal viewing angle is 65°, and the vertical viewing angle is 48°. As the specification, the CIS is provided for 13M pixels (4200 pixels in the horizontal direction, 3120 pixels in the vertical direction). To correspond to the above viewing angle, 65 pixels are formed per 1° in the horizontal direction and the vertical direction. The number of frames per 1 sec is 30 fps. Then, the vertical synchronization cycle is 33.3 msec.

In the required image quality, it may have distortion of up to 5 pixels in the horizontal direction and the vertical direction, per frame. The size of this distortion is in relation with the time and image quality required for position adjustment of the correction lens. Thus, it can be selected or adjusted based on the photographic usage.

Specifically, the time required for the shift of 1° is approximately 33.3*65/5=433 [msec]. In the case of the shift at 1°, the shift angle per frame is 1°*5/65=0.077. The adjustment holding period as a time for continuously shifting the correction lens can arbitrarily be set, for example, 10 to 15 frames (300 to 500 [msec]).

Accordingly, in the second embodiment, a plurality of frame periods including a plurality of exposure periods and a plurality of blanking periods are assumed as the position adjustment periods required for the position adjustment, and the position adjustment amount is divided into a plurality of subquantities in accordance with the position adjustment periods. The correction lens position control unit 43 controls the operation position of the correction lens 55, in a manner that the present operation position of the correction lens coincides with the changed target operation position which is obtained by adding each of the subquantities to the target operation position. As a result, the operation position of the correction lens 55 is gradually changed by the position adjustment amount, for a plurality of frame periods.

The rolling shutter distortion remains without being corrected by the OIS, due to the shift of the correction lens 55. However, this distortion may be corrected by the EIS.

[Details of Operation of OIS Module]

Descriptions will now be made to a camera shake correction procedure in this embodiment. In the following descriptions, it is assumed that the actuator 46 can drive the correction lens 55 in the vertical direction (Y direction) and the horizontal direction (X direction).

Specifically, let it be assumed that the update frequency of the camera shake information is 1 KHz (update cycle is 1 msec). The update frequency of position information of the correction lens is 20 KHz (update cycle is 50 μsec). The update frequency of the EIS position information is 30 Hz (update cycle is 33.3 msec). The specifications of the CIS and the optical system are the same as those described above. Of the vertical synchronization cycle 33.3 msec, the exposure period is 25 msec. The output signal of the Hall sensor is read by the ADC of 12 bits, and corresponds to the viewing angle. Then, the signal has 1000 [LSB] per 1° in the vertical direction and the horizontal direction.

In the above case of the numerical example, the shift angle per frame is obtained, based on the position adjustment amount from the present position of the correction lens to the appropriate position. In this case, when the shift amount of the correction lens per Hall feedback cycle (referred to as "Hall HB cycle") is expressed in the unit of pixels, it is expressed as $$\text{(shift angle per one frame)}*65*\text{(Hall } FB \text{ cycle)}/\text{(exposure period)} \quad (1)$$

When the shift amount of the correction lens per Hall feedback cycle is expressed in the unit of LSB, it is expressed as $$\text{(shift angle per one frame)}*100*\text{(Hall } FB \text{ cycle)}/\text{(exposure period)} \quad (2)$$

Figure 15:
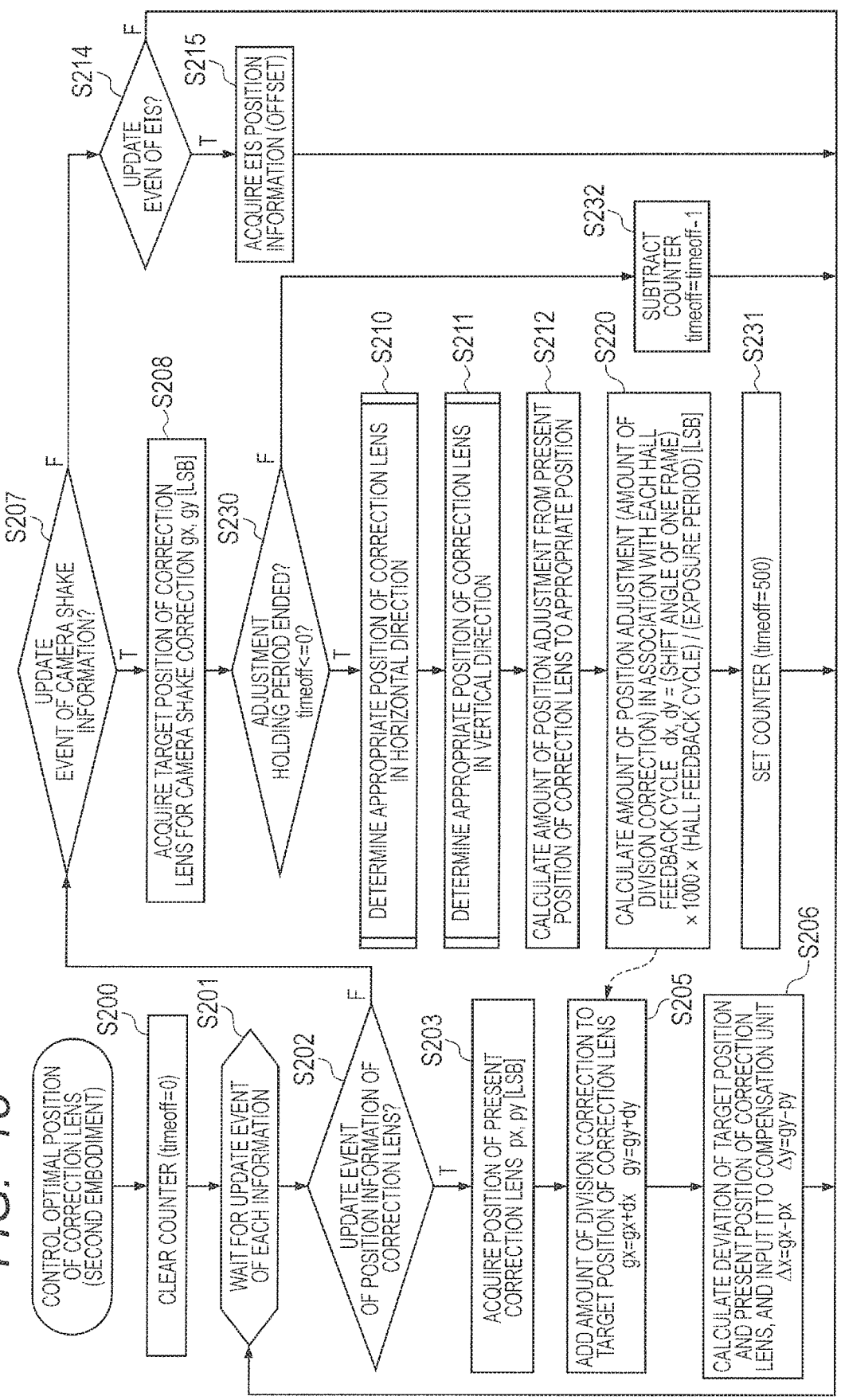
FIG. 15 is a flowchart illustrating a camera shake correction procedure in the case of the second embodiment.

FIG. 15 is a flowchart illustrating a camera shake correction procedure in the case of the second embodiment. In the procedure illustrated in FIG. 15, divided correction amounts dx and dy for position adjustment of the correction lens 55 are added to target positions gx and gy of the correction lens, at a timing of updating the output signal (that is, in each Hall feedback cycle) of the position detection sensor 47, such as a Hall sensor. As a result of this, new target positions gx and gy are set.

With reference to FIG. 14 and FIG. 15, in Step S200, a counter counting the elapse of the adjustment holding period is cleared.

In Step S201, the correction lens position control unit 43 waits for updating of output information from the position detection sensor 47, such as a Hall sensor, updating of output information from the shake detection sensor 41, such as a gyro sensor, or updating of the position of the output image by the EIS.

In Step S202, it is identified that the output from the position detection sensor 47, that is, the position information of the correction lens 55 has been updated ("TRUE" in Step S202). In this case, in Step S203, the correction lens position control unit 43 acquires information about the present position of the correction lens. The present position can be expressed with px and py in the unit of [LSB], using the X and Y coordinates.

In Step S205, the correction lens position control unit 43 changes the target operation position, by adding the divided correction amounts for the position adjustment of the correction lens to the target operation positions gx and gy [LSB] of the correction lens 55 which are calculated in accordance with the camera shake amount (Step S205).

The position adjustment amount and the divided correction amounts are set every time the adjustment holding period elapses (in this embodiment, every time the counter counts 500). In Step S220, the divided correction amounts are expressed with dx and dy in the unit of [LSB] using the X and Y coordinates.

In Step S206, the correction lens position control unit 43 calculates deviations Δx and Δy between the target operation positions gx and gy of the correction lens 55 and the present positions px and py, and inputs the deviations to the compensation unit 44. As a result, the operation position of the correction lens 55 is controlled in a manner to cancel the effect of the camera shake, while being shifted in a constant direction for the position adjustment, when the position adjustment amount is not "0". After this, the process returns to Step S201.

It is identified that the output from the shake detection sensor 41, such as a gyro sensor, that is the shake detection information has been updated ("FALSE" in Step S202, "TRUE" in Step S207). In this case, in Step S208, the correction lens position control unit 43 acquires target operation position of the correction lens 55 which has been calculated in accordance with the detected camera shake amount.

In Step S230, it is determined whether the adjustment holding period has been ended. That is, it is determined whether a count value "timeoff" of the counter is equal to or lower than "0". In the first execution, because the counter is cleared in Step S200, "TRUE" is obtained in Step S230.

When the adjustment holding period has been ended ("TRUE" in Step S230), Steps S210 to S212, S220, and S231 are executed.

Specifically, in Step S210, the correction lens position control unit 43 determines the appropriate position of the correction lens 55 in a horizontal direction, when judged that it is necessary to perform the position adjustment of the correction lens in the horizontal direction, based on the position information 81 of the correction lens 55 and the EIS position information 86. In Step S220, the correction lens position control unit 43 determines the appropriate position of the correction lens 55 in a vertical direction, when judged that it is necessary to perform the position adjustment of the correction lens in the vertical direction, based on the position information 81 of the correction lens 55 and the EIS position information 86.

The details of Step S210 are the same as those explained in FIG. 7 and FIG. 8, and the details of Step S211 are the same as those explained in FIG. 9 and FIG. 10, and thus will not be described over and over. Step S210 and Step S220 may parallelly be executed, or either of them may be executed before the other step.

In Step S212, the correction lens position control unit 43 obtains the position adjustment amount from the present operation position of the correction lens 55 to its appropriate position. When it is judged that the position adjustment in the X direction is not necessary in Step S210, a component of the position adjustment amount in the X direction is "0". Similarly, when it is judged that the position adjustment in the Y direction is not necessary in Step S211, a component of the position adjustment amount in the Y direction is "0".

In Step 220, the correction lens position control unit 43 calculates the divided correction amounts dx and dy [LSB] as the position adjustment amounts which are divided results in association with the Hall feedback cycle. The expression is shown in Expression (2).

In Step S231, the count value "timeoff" of the counter is set to 500. After this, the process returns to Step S201.

When the adjustment holding period has not been ended in Step S230 ("FALSE" in Step S230), after the count value "timmeoff" of the counter is decremented by 1 in Step S232, the process returns to Step S201. During the adjustment holding period, the shift of the correction lens continues in accordance with a preset divided adjustment amount. Thus, the position adjustment amount cannot newly be calculated.

Let it be assumed that the position information of the output image by the EIS is updated ("FALSE" in Step S202, "FALSE" in Step S207, "TRUE" in Step S214). In this case, in Step S215, the correction lens position control unit 43 acquires the EIS position information 86 (that is, information representing the position of the EIS output image 112 corresponding to the photographed image 111). The EIS position information 86 is used when to determine the appropriate position of the correction lens in Steps S210 and S211. After this, the process returns to Step S201.

Figure 16:
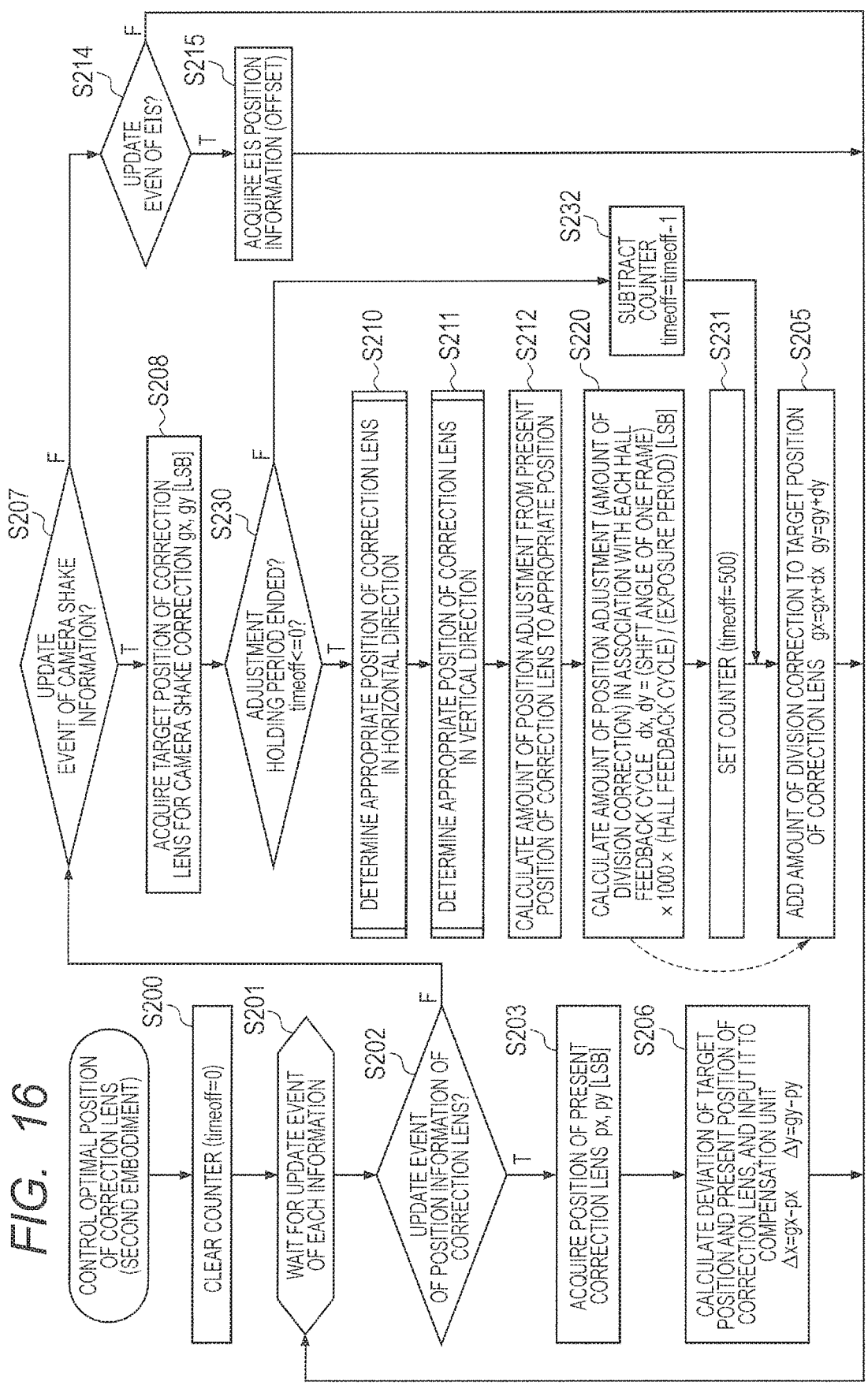
FIG. 16 is a flowchart illustrating a modification of the camera shake correction procedure of FIG. 15.

FIG. 16 is a flowchart illustrating a modification of the camera shake correction procedure of FIG. 15. In the control procedure illustrated in FIG. 16, divided correction amounts dx and dy for position adjustment of the correction lens are added to target positions gx and gy of the correction lens 55, at a timing of updating (that is, at each detection cycle of the gyro sensor) the output signal of the shake detection sensor 41, such as a gyro sensor. As a result of this, new target positions gx and gy are set.

Specifically, in the control procedure of FIG. 16, Step S205 of FIG. 15 is executed at the end of a series of processes executed when an update event of the camera shake information ("TRUE" in Step S207) has occurred, that is, after Steps S231 and S232. Any other points of FIG. 16 are the same as those of FIG. 15, and the same or corresponding parts are identified by the same reference numerals, thus will not be described over and over.

Because the detection cycle of the gyro sensor is longer than the Hall feedback cycle (1 KHz to 20 KHz), the calculation frequency can be reduced, if the divided correction amount is calculated at each detection cycle of the gyro sensor. It is assumed that a processor for calculating an output signal of the gyro sensor is used as a processor suitable for calculations of a large number of significant digits. Thus, though there is no essential difference, the control procedure of FIG. 16 is more preferable than the control procedure of FIG. 15.

Effect of Second Embodiment

According to this embodiment, the imaging timing signal is not required for the position adjustment of the correction lens. Thus, only a minimum system change, such as replacing the software of the OIS module 40, can realize the optimum positioning of the correction lens.

In this embodiment, there is a disadvantage that the shift of the correction lens requires a long period of time. Therefore, the OIS and the EIS reach the correction limit. This may possibly result in deteriorating the image quality.

Third Embodiment

Features of Third Embodiment

In the OIS module 40 of this embodiment, like the case of the second embodiment, while the correction lens is shifted in one direction for its position adjustment, the correction is also performed based on the camera shake amount. Note, however, that, in this embodiment, the period in the vertical synchronization cycle including the exposure period is assumed as the position adjustment period. The operation position of the correction lens is gradually changed for this position adjustment period, thereby completing the position adjustment of the correction lens. Then, any unnecessary settling period is not generated, and it is possible to reduce the possibility of deteriorating the image quality as a result that the OID and the EIS reach the correction limit.

The photographed image 111 photographed by the imaging element 50 is distorted due to the shift of the correction lens in a constant direction. Because this distortion is a rolling shutter distortion, it is possible to correct it by the EIS. In other words, the correction lens 55 is shifted in a constant direction in the exposure period on the assumption of the correction by the EIS.

Further, the starting and stopping of the shift for the position adjustment of the correction lens are performed in the blanking period. In the exposure period, the correction lens is shifted in a constant direction, and a distortion occurring due to the shift of the correction lens is uniformly generated, because there is no sudden speed change in the shift. As a result, it facilitates the correction of the distortion by the EIS.

To certainly remove, by the EIS, the image distortion generated due to the shift of the correction lens 55 during the exposure period, the correction lens 55 is preferably shifted at a constant speed in a constant direction. In this case, for example, when the imaging element 50 is a CMOS image sensor of a rolling shutter system, an optical image of the photographic object having a rectangular contour is modified in a parallelogram or vertically expands or contracts. If this change is made in its form, it is possible to perform the correction by the EIS. It should be noted whether the distortion generated in the image due to the shift of the correction lens 55 can be corrected by the EIS depends on correction performance of the EIS module 62. Therefore, if the correction performance of the EIS module 62 is high, the correction lens 55 for the position adjustment is not necessarily shifted at a constant speed.

[Entire Configuration of Electronic Device]

Descriptions will now be made to the electronic device 30c of this embodiment with reference to the accompanying drawings.

Figure 17:
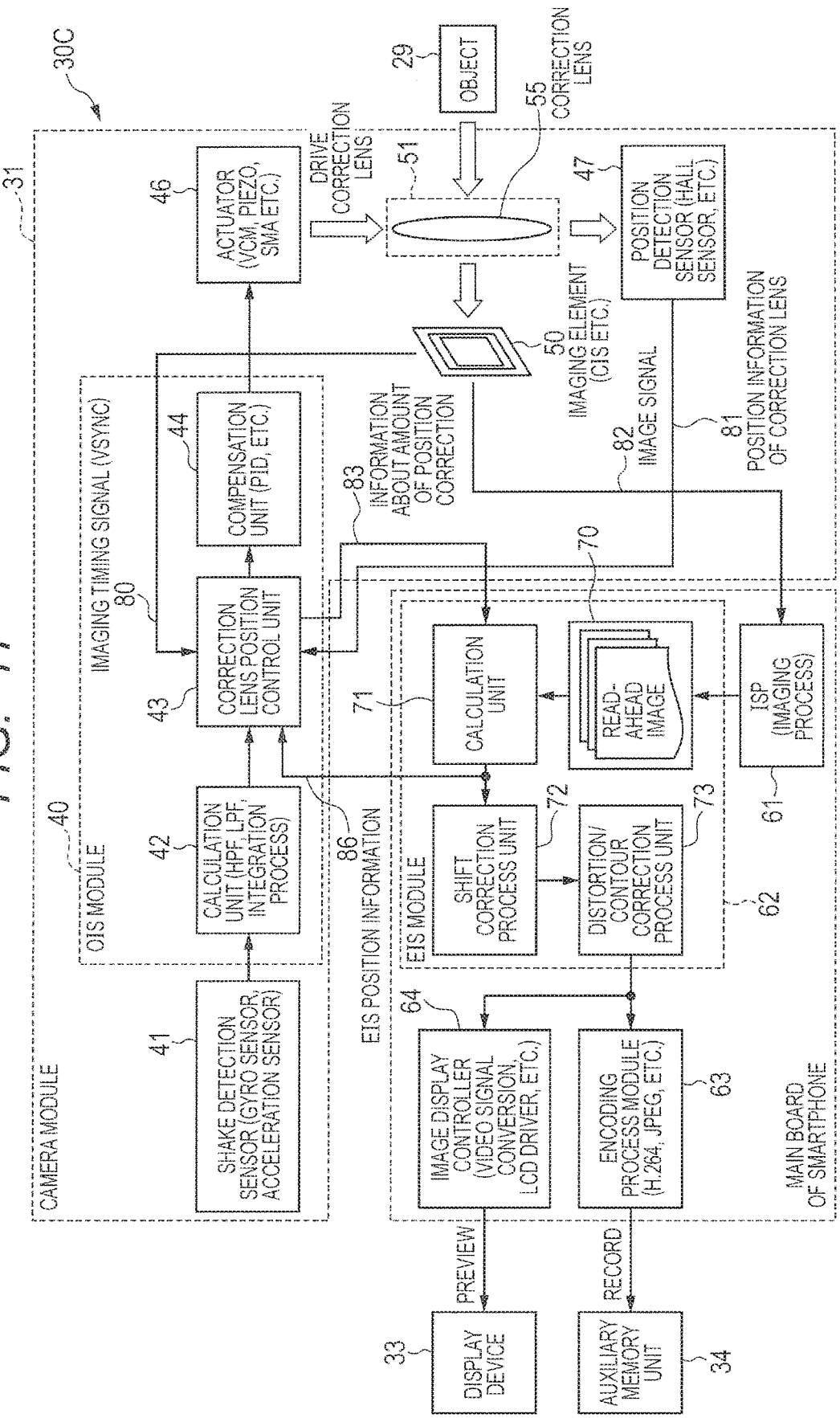
FIG. 17 is a block diagram illustrating a configuration example of an electronic device 30C of a third embodiment.

FIG. 17 is a block diagram illustrating a configuration example of the electronic device 30C of the third embodiment. The block diagram of FIG. 17 corresponds to that of FIG. 1 of the first embodiment.

The electronic device 30C of FIG. 17 differs from the electronic device 30A of FIG. 1 in a point that information 83 regarding the position adjustment amount (that is, information regarding the position adjustment of the correction lens 55) is transmitted from the correction lens position control unit 43 of the OIS module 40 to the EIS module 62.

The information 83 regarding the position adjustment amount is used for correction in the movement correction process unit 72 and the distortion/contour correction process unit 73. As a result, the EIS module 62 can certainly correct the image distortion due to the position adjustment of the correction lens 55. If it is possible to certainly detect the movement of the photographic object in the screen by the calculation unit 71, the information 83 regarding the position adjustment amount is not necessarily required.

Because any other points of the electronic device 30C of FIG. 17 are the same as those of the electronic device 30A of FIG. 1, the same or corresponding parts are identified by the same reference numerals, and thus will not be described over and over.

[Timing Diagram of Camera Shake Correction Process]

Figure 18:
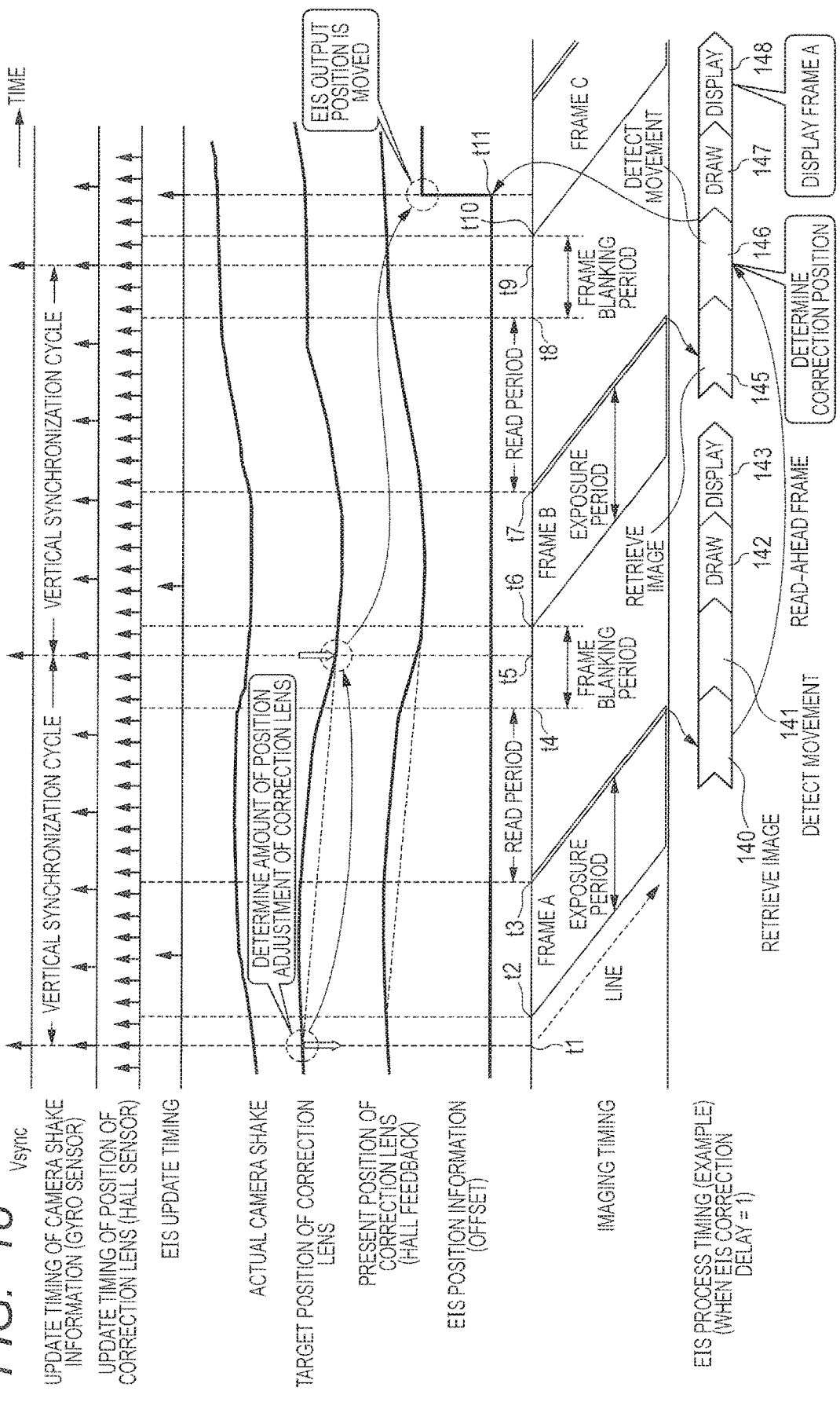
FIG. 18 is a timing diagram of the camera shake correction process in the electronic device of the second embodiment.

FIG. 18 is a timing diagram of the camera shake correction process in the electronic device of the second embodiment. The timing diagram of FIG. 18 corresponds to the timing diagram of FIG. 11. It is assumed that the update cycle of each signal is the same as that of FIG. 11. Note that the update timing illustrated in FIG. 18 is only a schematic example, and does not accurately reflect the illustrated cycle.

With reference to FIG. 17 and FIG. 18, the vertical synchronization signal Vsync is output from the imaging element 50 at the times t1, t5, and t9 in the frame blanking period. The screen position (offset) is updated by the EIS at the same cycle as the vertical synchronization cycle.

In the case of FIG. 18, the correction lens 55 is shifted near the mechanical center, not to crash into the mechanical end, between the time t1 in the frame blanking period and the time t5 in the frame blanking period. Any change in the image distortion and the composition due to this shift of the correction lens 55 is absorbed by updating the output image 112 by the EIS at the time t10.

For the purpose of improving the camera shake correction performance, it is better that the time required for shifting the correction lens is short as much as possible in a range where the settling period does not cause a problem. Thus, the shift period of the correction lens is set equal to or approximately equal to the cycle of the vertical synchronization signal. A bias component is set not to be changed in the exposure period, thereby facilitating the correction by the EIS. Thus, the generation and cancellation of the bias component for the camera shake correction component are performed, based on a signal representing (for example, vertical synchronization signal Vsync) the start of the frame blanking period.

In a specific example, when the correction range (change range of the position coordinates Ox and Oy) of the OIS is ±1.5°, and when each of the position coordinates Ox and Oy exceeds ±1.0° or smaller than −1.0°, the correction lens is controlled to be shifted from the mechanical end to the mechanical center. As explained in FIG. 3, the above-described position coordinates (Ox and Oy) represent the displacement amount of the center 114 of the photographed image 111 relative to the center 113 of the photographable range 110.

In the above setting case, the correction lens is shifted by an amount corresponding to 1° of a viewing angle between the vertical exposure cycles (or exposure periods). Thus, the shift amount of the correction lens per servo control cycle (corresponding to the Hall feedback cycle) is equal to (all shift amounts: 1.0°)*(Hall feedback cycle)/(exposure period).

Using the numerical example explained in FIG. 3, the number of images of the CMOS image sensor is 13M pixels (4200*3120 pixels). In an optical system in which the focal distance is 28 mm at the conversion of 35 mm, the orthogonal viewing angle is 75°, and the horizontal viewing angle is 65°, and the vertical viewing angle is 48°. In this case, 1° in the vertical viewing angle and the horizontal viewing angle corresponds approximately to 65 pixels. Reading of the Hall sensor is performed by the ADC of 12 bits, and 1° in the vertical viewing angle and the horizontal viewing angle corresponds to a read signal of approximately 1000 LSB.

Using the above numerical example, when the shift amount of the correction lens per Hall feedback cycle is expressed in the unit of pixels, it is expressed as $$\text{(all shift angles)}*65*\text{(Hall } FB \text{ cycle)/(exposure period)} \qquad (3)$$

When the shift amount of the correction lens per Hall feedback cycle is expressed in the unit of LSB, it is expressed as $$\text{(all shift angles)}*1000*\text{(Hall } FB \text{ cycle)/(exposure period)} \qquad (4)$$

For example, if the number of frames per second is 30 fps, the update frequency of the output image of the EIS is 30 Hz (update cycle is 33.3 msec). In the above numerical example, the correction lens may simply be shifted by 65 pixels during 3120 line scanning processes, and approximately 48 lines are equivalent to the shift amount of 1 pixel. Thus, it can be expected that a preferable image with less deterioration can be photographed, though it may depend on the performance of the EIS.

[Details of Camera Shake Correction Procedure]

Figure 19:
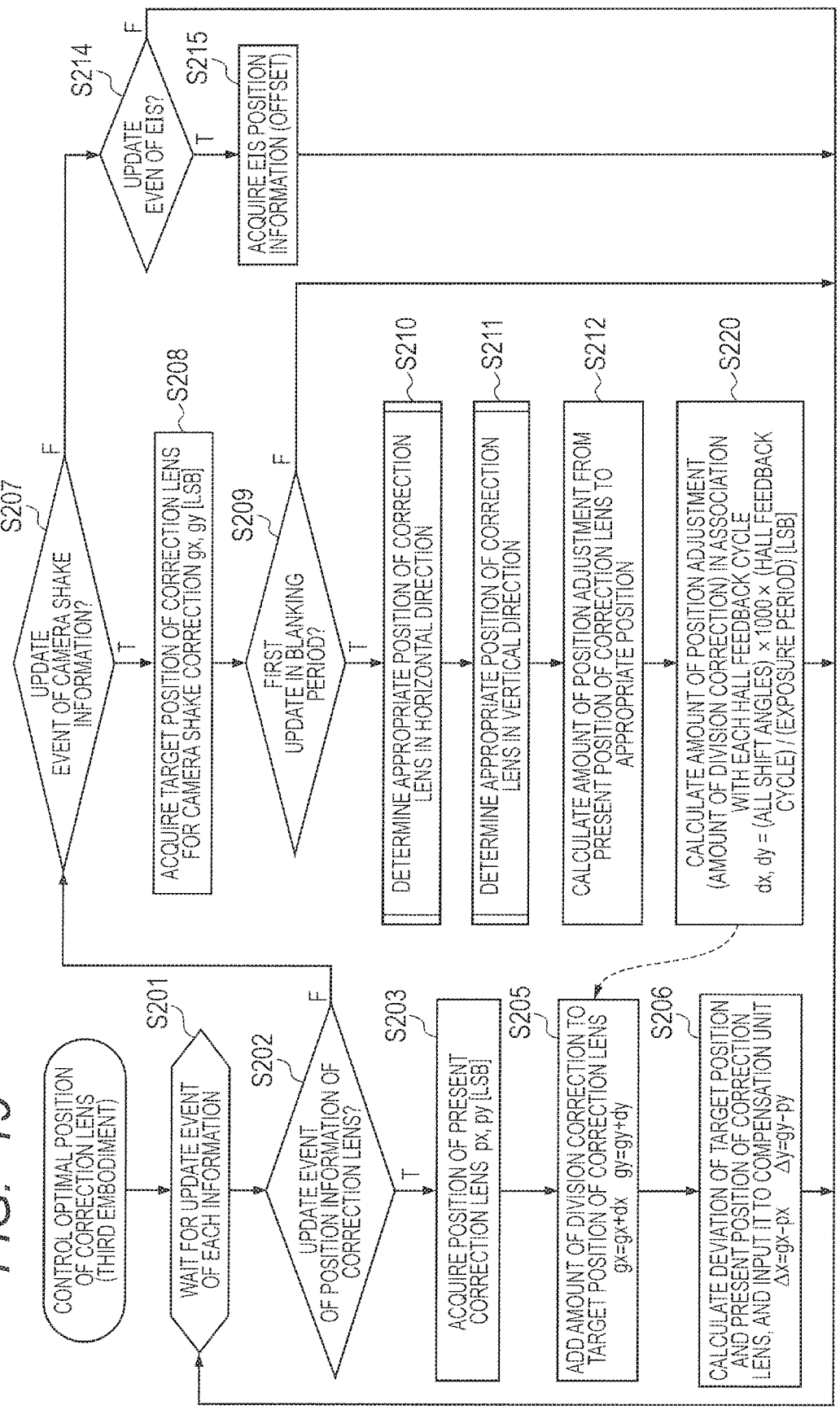
FIG. 19 is a flowchart illustrating a camera shake correction procedure in the case of the third embodiment.

FIG. 19 is a flowchart illustrating a camera shake correction procedure in the case of the third embodiment. In the procedure illustrated in FIG. 19, divided correction amounts dx and dy for position adjustment of the correction lens 55 are added to target positions gx and gy of the correction lens, at a timing of updating the output signal of the position detection sensor 47, such as a Hall sensor (that is, in each Hall feedback cycle). As a result of this, new target positions gx and gy are set.

With reference to FIG. 17 and FIG. 19, in Step S201, the correction lens position control unit 43 waits for updating of output information from the position detection sensor 47, such as Hall sensor, updating of output information form the shake detection sensor 41, such as a gyro sensor, or updating of the position of an output image by the EIS.

In Step S202, it is identified that the output from the position detection sensor 47, that is, the position information of the correction lens 55 has been updated ("TRUE" in Step S202). In this case, in Step S203, the correction lens position control unit 43 acquires information about the present position of the correction lens. The present position can be expressed with px and py in the unit of [LSB], using the X and Y coordinates.

In Step S205, the correction lens position control unit 43 changes the target operation position, by adding the divided correction amounts for the position adjustment of the correction lens to the target operation positions gx and gy [LSB] of the correction lens 55 which are calculated in accordance with the camera shake amount (Step S205).

The position adjustment amount and the divided correction amounts are set every time the output of the shake detection sensor 41 is first updated in the blanking period, in each vertical synchronization cycle. In Step S220, the divided correction amounts are expressed with dx and dy in the unit of [LSB] using the X and Y coordinates.

In Step S206, the correction lens position control unit 43 calculates deviations Δx and Δy between the target operation positions gx and gy of the correction lens 55 and the present positions px and py, and inputs the deviations to the compensation unit 44. As a result, the operation position of the correction lens 55 is controlled in a manner to cancel the effect of the camera shake, while being shifted in a constant direction for the position adjustment, when the position adjustment amount is not "0". After this, the process returns to Step S201.

It is identified that the output from the shake detection sensor 41, such as a gyro sensor, that is, the shake detection information has been updated ("FALSE" in Step S202, "TRUE" in Step S207). In this case, in Step S208, the correction lens position control unit 43 acquires target operation positions gx and gy of the correction lens 55 which have been calculated in accordance with the detected camera shake amount.

When the output of the shake detection sensor 41 is first updated in the blanking period ("TRUE" in Step S209), the following procedures of Steps S210, S211, S212, and S220 are executed.

Specifically, in Step S210, the correction lens position control unit 43 determines the appropriate position of the correction lens 55 in a horizontal direction, when judged that it is necessary to perform the position adjustment of the correction lens in the horizontal direction, based on the position information 81 of the correction lens 55 and the EIS position information 86. In Step S220, the correction lens position control unit 43 determines the appropriate position of the correction lens 55 in a vertical direction, when judged that it is necessary to perform the position adjustment of the correction lens in the vertical direction, based on the position information 81 of the correction lens 55 and the EIS position information 86.

The details of Step S210 are the same as those explained in FIG. 7 and FIG. 8, and the details of Step S211 are the same as those explained in FIG. 9 and FIG. 10, and thus will not be described over and over. Step S210 and Step S220 may parallelly be executed, or either of them may be executed before the other step.

In Step S212, the correction lens position control unit 43 obtains the position adjustment amount from the present operation position of the correction lens 55 to its appropriate position. When it is judged that the position adjustment in the X direction is not necessary in Step S210, a component of the position adjustment amount in the X direction is "0". Similarly, when it is judged that the position adjustment in the Y direction is not necessary in Step S211, a component of the position adjustment amount in the Y direction is "0".

In Step 220, the correction lens position control unit 43 calculates the divided correction amounts dx and dy [LSB] as the position adjustment amounts which are divided results in association with the Hall feedback cycle. The expression is shown in Expression (4). After this, the process returns to Step S201.

Let it be assumed that the position information of the output image by the EIS is updated ("FALSE" in Step S202, "FALSE" in Step S207, "TRUE" in Step S214). In this case, in Step S215, the correction lens position control unit 43 acquires the EIS position information 86 (that is, information representing the position of the EIS output image 112 corresponding to the photographed image 111). The EIS position information 86 is used when to determine the appropriate position of the correction lens in Steps S210 and S211. After this, the process returns to Step S201.

Figure 20:
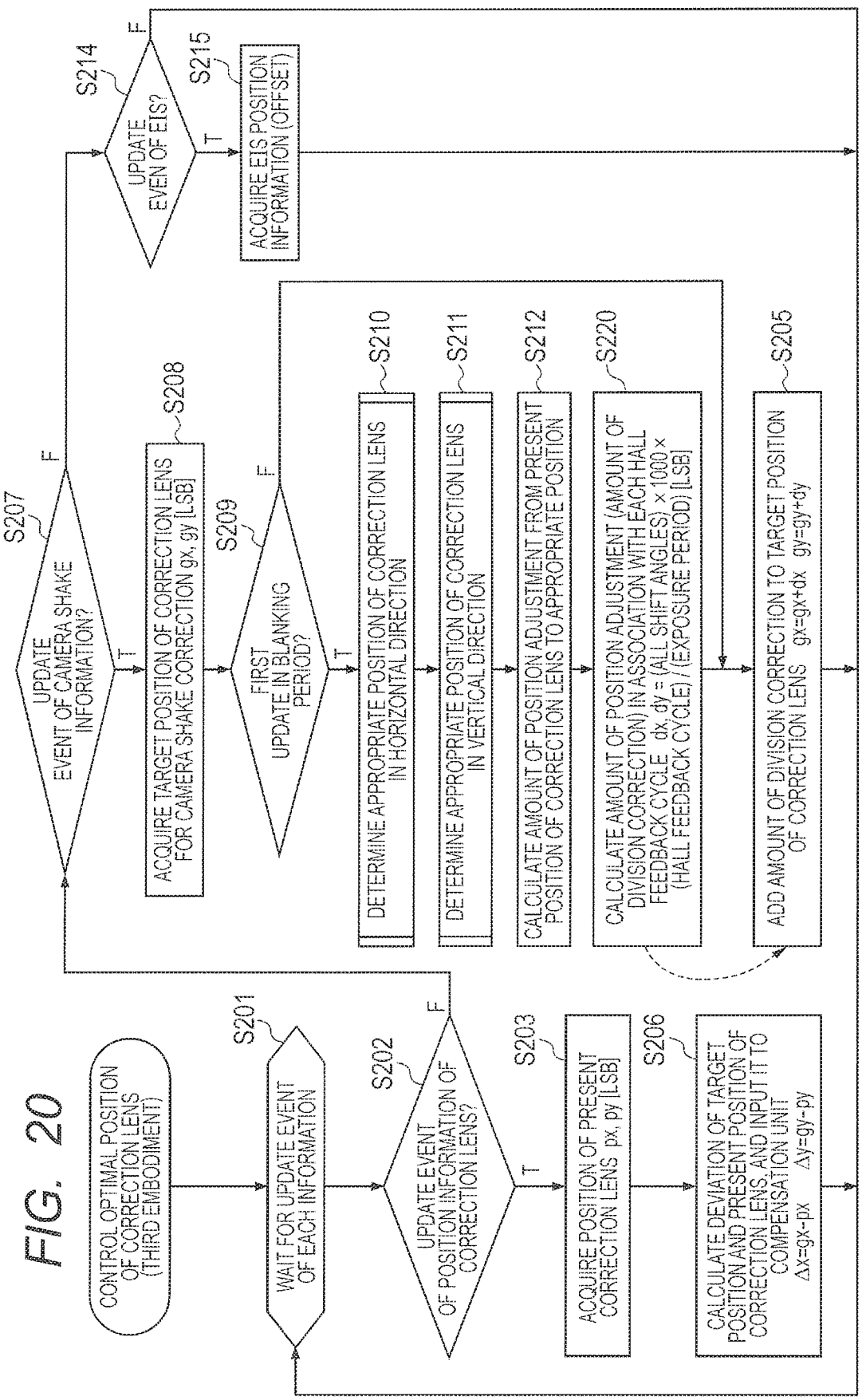
FIG. 20 is a flowchart illustrating a modification of the camera shake correction procedure of FIG. 19.

FIG. 20 is a flowchart illustrating a modification of the camera shake correction procedure of FIG. 19. In the control procedure illustrated in FIG. 20, divided correction amounts dx and dy for position adjustment of the correction lens 55 are added to target positions gx and gy of the correction lens 55, at a timing of updating (that is, at each detection cycle of the gyro sensor) the output signal of the shake detection sensor 41, such as a gyro sensor. As a result of this, new target positions gx and gy are set.

Specifically, in the control procedure of FIG. 20, Step S205 of FIG. 19 is executed at the end of a series of processes executed when an update event of the camera shake information ("TRUE" in Step S207) has occurred, that is, after Step S220 or in the case of "FALSE" in Step S209. Any other points of FIG. 20 are the same as those of FIG. 19, and the same or corresponding parts are identified by the same reference numerals, thus will not be described over and over.

Effect of Third Embodiment

As described above, according to this embodiment, the position adjustment of the correction lens is performed, while the OIS performs the camera shake correction during one exposure period. Then, the image distortion due to the position adjustment of the correction lens is removed by the EIS. As a result, it is possible to continuously execute the camera shake correction by the OIS, while preventing that the correction lens crashes into the mechanical end.

The shift start and the shift end of the correction for position adjustment are performed during the blanking period. As a result, the entire frame image is uniformly distorted, instead of a part of the frame image, due to the position adjustment of the correction lens. Thus, it facilitates the correction of the image distortion by the EIS, and it is possible to acquire a high quality image.

In the first embodiment, the correction lens has been adjusted only in the frame blanking period. Thus, the shift speed of the correction lens is very high. This results in requiring a settling period of approximately 5 msec. This differs from a request for securing as long exposure period as possible for reducing the noise of the imaging element. According to this embodiment, the above-described settling period is not necessary.

As compared with the second embodiment, the correction lens is shifted for position adjustment only during the photographing period of one frame. Thus, the position adjustment of the correction lens can be ended in a short period of time, under a condition that the correction of the image distortion is facilitated by the EIS. As a result, the OIS and the EIS reach the correction limit, thus resulting in reducing the possibility of deteriorating the image quality.

Fourth Embodiment

In the fourth embodiment, descriptions will be made to a modification of the hardware configuration.

First Configuration Example

Figure 21:
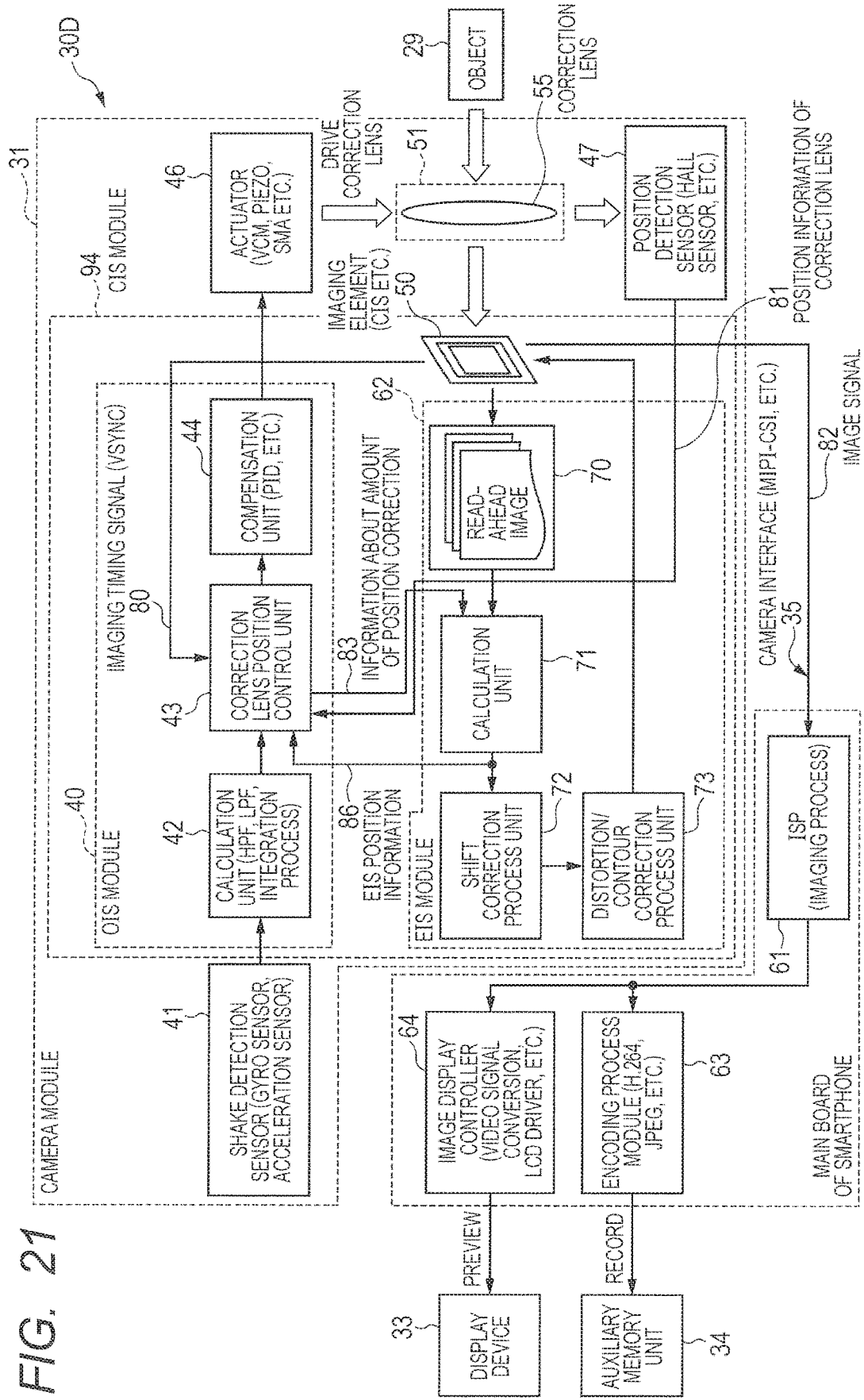
FIG. 21 is a block diagram illustrating a configuration of an electronic device 30D according to a first configuration example of a fourth embodiment.

FIG. 21 is a block diagram illustrating of a configuration of the electronic device 30D according to the first configuration example of the fourth embodiment. FIG. 21 illustrates a configuration in which the OIS module 4 and the EIS module 62 are both built in the camera module 31.

The electronic device 30D of FIG. 21 differs from the electronic device 30A of FIG. 1 in a point that the EIS module 62 is built in the camera module 31 instead of being provided on the main board 32. In the case of FIG. 21, the OIS module 40, the EIS module 62, and the imaging element 50 are collectively referred to as the CIS module 94.

With reference to FIG. 21, a raw image signal (that is, RAW data) output from the imaging element 50 is corrected by the EIS module 62. The image signal 82 after corrected is transmitted to the image signal processor 61 through a camera interface 35, such as a CSI-2 (Camera Serial Interface-2) of the MIPI (Mobile Industry Processor Interface Alliance). The image-processed signal by the image signal processor 61 is transmitted to the encoding process module 63 and the image display controller 64. Because any other configuration of FIG. 21 is the same as that of FIG. 1, the same or corresponding constituent elements are identified by the same reference numerals, and thus will not be described over and over.

According to the configuration of FIG. 21, the EIS and the OIS can be processed using the same processor. In the related art, it has been assumed that the communication between the EIS and the OIS is performed through an I2C (Inter-Integrated Circuit including, for example, CCI (Camera Control Interface) of MIPI CSI-2). However, it may be replaced with inter-task communication on the same processor. Therefore, it is possible to reduce the communication overhead, by the I2C, between the camera module 31 and the main board 32.

The imaging timing signal 80, such as the vertical synchronization signal, is communicated on the same processor, thereby simplifying the system configuration.

The camera shake adjustment can be executed by a single camera module, regardless of the program for Smartphone. In the related art, when to incorporate the EIS module in the same chip as the application processor, a problem is that development man-hours are increased in order for the software to be optimized for the hardware. On the other hand, if the camera shake mechanism is entirely built in the camera module, there are some advantages of reducing the development man-hours for the smartphone system, and of facilitating development of the Smartphone products.

It is possible to select either the hardware configuration of FIG. 1 or the hardware configuration of FIG. 21, in accordance with the usage, the necessary functions and performance, and the system cost. When the hardware configuration of FIG. 21 is employed, the functions of the EIS can be reduced, in accordance with the system resource (for example, the memory capacity) of a CIS module 94.

Second Configuration Example

Figure 22:
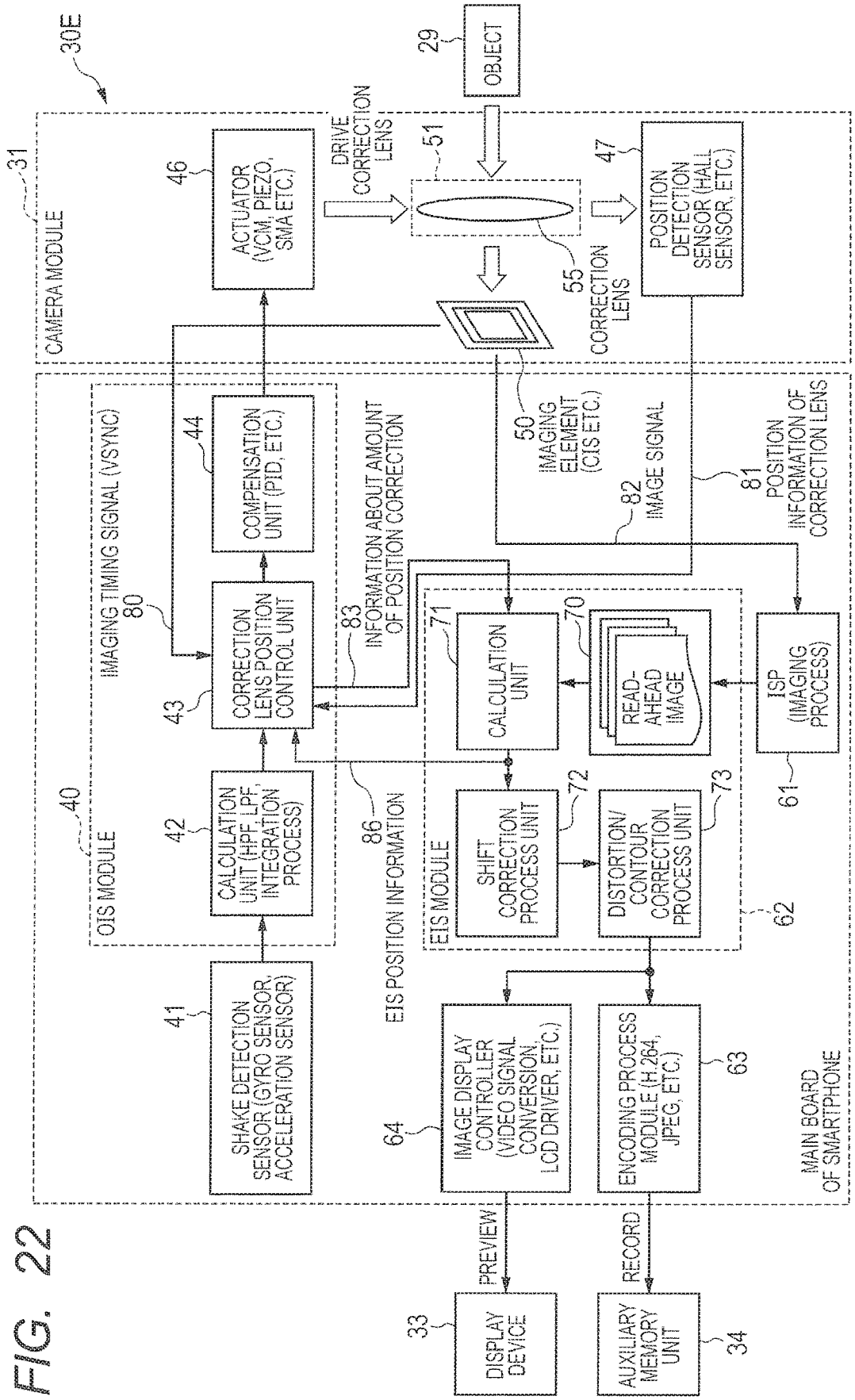
FIG. 22 is a block diagram illustrating a configuration of an electronic device 30E according to a second configuration example of the fourth embodiment.

FIG. 22 is a block diagram illustrating a configuration of the electronic device 3E according to the second configuration example of the fourth embodiment. FIG. 22 illustrates the configuration example in which both of the OIS module 4 and the EIS module 62 are arranged on the main board 32.

Specifically, the electronic device 30E of FIG. 22 differs from the electronic device 30A of FIG. 1 in a point that the shake detection sensor 41 and the OIS module 40 are arranged on the main board 32. Because any other points of FIG. 22 are the same as those of FIG. 1, the same or corresponding parts are identified by the same reference numerals, and thus will not be described over and over.

When the OIS module is incorporated in the same chip as the application processor, it can be considered that it is incorporated in a CPU or DSP for a sensor hub integrating setting for various sensors (for example, a gyro sensor, a magnetic sensor, an acceleration sensor, an atmospheric pressure sensor).

As described above, as the background of implementing the OIS process in the main board 32, in the SoC (System on Chip) for Smartphones in recent years, there is an example of a multi-core system by tight coupling of asymmetrical processors by combining a high performance/large scale core and a small amount power/small scale core. Thus, it is possible to efficiently implement those processes requiring high responses and a small amount of calculations, like the OIS or music reproducing.

According to the configuration of FIG. 22, as compared with the configuration of FIG. 21 for realizing the EIS using the CIS module 94, there is relatively no restriction on the system resources (memory, CPU, GPU) to be used by the EIS. Thus, an advantage is that it is possible to realize an advanced EIS.

As an implementation example of the OIS in the case of the first embodiment, it is assumed that the feedback (servo) cycle from the Hall center is 20 KHz to 50 KHz, and the update cycle of the output data from the gyro center is approximately 1 KHz to 10 KHz. Further, it is assumed that information transmission from the OIS to the EIS is performed with the 12C. Thus, the overhead (for example, communication delay or a process for communication) in the data transfer tends to be increased. On the contrary, in the configuration of FIG. 22, the OIS module 40 and the EIS module 62 can be mounted on the same chip of the main board 32. Thus, improvement of the communication overhead between the OIS module 40 and the EIS module 62 can be expected.

The OIS module 40 and the EIS module 62 can be realized commonly on the chip of the main board 32, together with the image signal processor 61, the encoding process module 63, and the image display controller 64. Thus, it is possible to collectively adjust the entire camera system, and is useful for developing and adjusting the camera system.

Another Modification (1) The technique of the present disclosure is applicable to the OIS of a sensor shift system. The feature of the camera correction in the OIS of the sensor shift system is that it can also correspond to correction in the roll direction. In this case, the roll correction is performed also in the EIS, and an oblique cutting process illustrated in FIG. 23 is performed.

Figure 23:
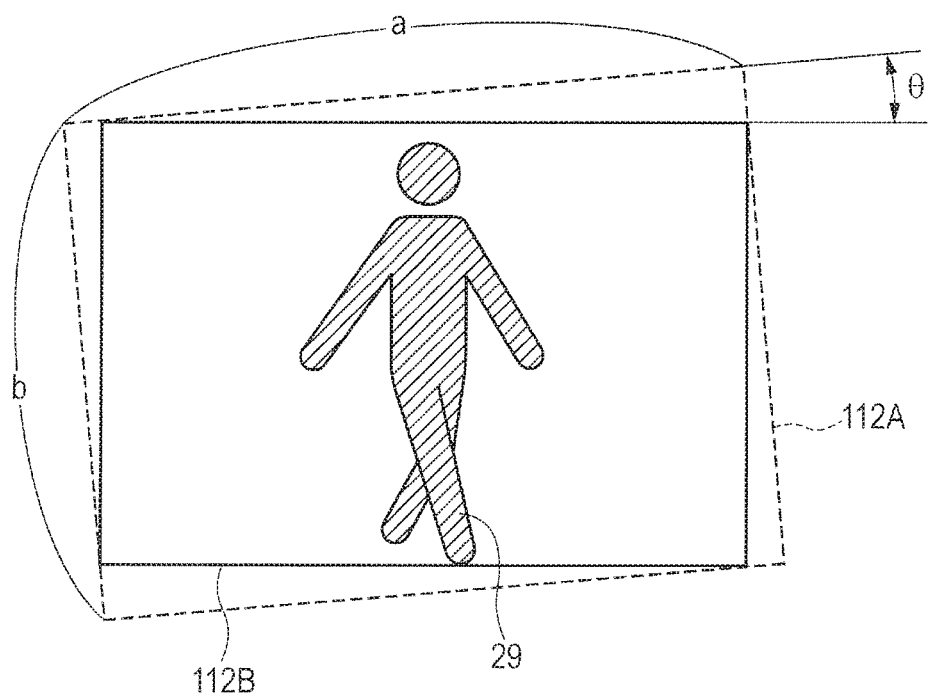
FIG. 23 is a diagram for explaining role correction in the EIS.

FIG. 23 is a diagram for explaining roll correction in the EIS. As explained in FIG. 23, in the EIS, there is performed a process for cutting the output image 112 from the photographed image 111. In the case of FIG. 23, a quadrangle illustrated with a dotted line corresponds to a cut image 112A cut out from the photographed image 111. This cut image 112A is rotated by a rotational angle θ, thereby generating a final output image 112B illustrated with a solid line.

In FIG. 23, if the long side of the cut image 112A has a length "a", a correction margin for roll of "2a·sin θ" is necessary in a vertical direction. Similarly, if the short side of the cut image 112A has a length "b", a correction margin for roll of "2b·sin θ" is necessary in a horizontal direction. Therefore, "b·sin θ" is added to each of correction margins EMX1 and EMX2 of the EIS explained in FIG. 3, while "a·sin θ" is added to each of the correction margins EMY1 and EMY2. The appropriate position of the image sensor is determined, using the EIS correction margins in the horizontal direction and the vertical direction after addition of the correction margins for roll.

(2) The camera shake correction technique of this disclosure is applicable also in the case of still image photographing, as long as a camera has an EIS function for correcting the rolling shutter distortion.

In general, in the still image photographing, due to the exposure of only one frame, the photographed image 111 is position in the center of the photographable range 110 in FIG. 3, in a manner to maximize the OIS correction margin and the EIS correction margin at the exposure start point (that is, before opening the shutter). As a result, the output image 112 can be positioned in the center of the photographed image 111.

However, mainly in Smartphone or digital cameras, when a preview is displayed using the LCD (when an optical system finder is not provided), a request for camera shake correction is often made even in a preview state. This is because even a user unfamiliar with cameras can easily aim the object. When the process progresses from the preview state immediately to the still image photographing, the position of the correction lens cannot be returned to the mechanical center right before the still image photographing. The reason for this is that the photography would be performed in a composition different from that determined by the user in the preview.

According to this disclosure, when the camera shake correction is performed in a preview state before starting the exposure for the still image photographing, the position of the correction lens is adjusted in accordance with the OIS correction margin and the EIS correction margin. As a result, it is possible to prevent a case in which the OIS and the EIS cannot be used.

The inventions by the present inventors have specifically been described based on the preferred embodiment. The present invention is not limited to the preferred embodiment, and various changes may be made without departing from the scope thereof.

What is claimed is:

1. A semiconductor device for controlling a camera module which implements optical camera shake correction for displacing or modifying a shiftable object as at least one element included in an optical system and an imaging element, in accordance with a camera shake amount, the semiconductor device comprising:
   a first circuit that operates as:
      a calculation unit which calculates the camera shake amount of the optical system based on a detection value of a shake detection sensor, and calculates a target operation position of the shiftable object based on the calculated camera shake amount; and
      a position control unit which sets a position adjustment amount of an adjustment operation position of the shiftable object, based on information representing a present operation position of the shiftable object and information representing a position of an output image of an electronic camera shake correction module with respect to a photographed image photographed by the imaging element, and outputs a signal for controlling the adjustment operation position of the shiftable object based on the target operation position and the position adjustment amount,
   wherein the photographed image has a quadrangle form defined by first and second sides corresponding to a row of the imaging element and third and fourth sides corresponding to a column of the imaging element,
   wherein a photographable range of the imaging element corresponding to a mechanical shiftable range of the shiftable object is in a quadrangle range separated by a first space, a second space, a third space, and a fourth space from the first side, the second side, the third side, and the fourth side, the first to fourth spaces being determined in accordance with the adjustment operation position of the shiftable object,
   wherein the output image of the electronic camera shake correction module has a quadrangle form separated by a fifth space, a sixth space, a seventh space, and an eighth space from the first side, the second side, the third side, and the fourth side, the fifth to eighth spaces being determined in accordance with the position of the output image, and
   wherein the position control unit sets the position adjustment amount in a manner to further enlarge the first space, when the first space is smaller than a first threshold value, and when the fifth space is equal to or greater than a second threshold value.

2. The semiconductor device according to claim 1, wherein the position control unit sets the position adjustment amount, based on an operation margin from the present operation position of the shiftable object to a shiftable limit and a correction margin for electronic camera shake correction, equivalent to a space between an end of the photographed image and an end of the output image.

3. The semiconductor device according to claim 1, wherein the position control unit sets the position adjustment amount in a manner to further reduce, when the fifth space is smaller than the second threshold value, and when the first space is equal to or greater than a third threshold value which is greater than the first threshold value.

4. The semiconductor device according to claim 1, wherein the position control unit sets the position adjustment amount in a manner to further enlarge the first space gradually or continuously, as there is a large difference between the fifth space and the second threshold value.

5. The semiconductor device according to claim 1, wherein the position control unit sets the position adjustment amount in a manner to further enlarge the third space, when the third space is smaller than a fourth threshold value, and when the seventh space is equal to or greater than a fifth threshold value.

6. The semiconductor device according to claim 5, wherein the position control unit sets the position adjustment amount in a manner to further reduce the third space, when the seventh space is smaller than the fifth threshold value, and when the third space is equal to or greater than an eighth threshold value which is greater than the fourth threshold value.

7. The semiconductor device according to claim 1, wherein the position control unit controls the adjustment operation position of the shiftable object in a manner that the adjustment operation position of the shiftable object is changed by the position adjustment amount, in a blanking period.

8. The semiconductor device according to claim 1, wherein the position control unit calculates a divided correction amount by dividing the position adjustment amount into a plurality of amounts in accordance with a position adjustment period, and controls the adjustment operation position of the shiftable object in a manner that the present operation position of the shiftable object coincides with the changed target operation position which is obtained by adding the divided correction amount to the target operation position.

9. The semiconductor device according to claim 8, wherein the position control unit sets a plurality of frame periods including a plurality of exposure periods and a plurality of blanking periods as the position adjustment period, and controls the adjustment operation position of the shiftable object in a manner that the adjustment operation position of the shiftable object is changed by the position adjustment amount gradually for the position adjustment period.

10. The semiconductor device according to claim 8, wherein the position control unit sets a period in one frame period including an exposure period as the position adjustment period, and controls the adjustment operation position of the shiftable object in a manner that the adjustment operation position of the shiftable object is changed by the position adjustment amount gradually for the position adjustment period.

11. The semiconductor device according to claim 9, wherein the position control unit controls the adjustment operation position of the shiftable range in a manner to start displacement or modification of the shiftable object for its operation position adjustment in the blanking period, and to end the displacement or modification of the shiftable object for its operation position adjustment in the blanking period.

12. The semiconductor device according to claim 10, wherein an image distortion generated by changing the adjustment operation position of the shiftable object in accordance with the position adjustment amount is removed by electronic camera shake correction.

13. The semiconductor device according to claim 12,
wherein the imaging element performs photographing using a rolling shutter system, and
wherein the image distortion is a rolling shutter distortion.

14. The semiconductor device according to claim 12, wherein the position control unit outputs information representing the position adjustment amount to at least one second circuit executing the electronic camera shake correction.

15. An electronic device comprising:
an imaging element;
an optical system for controlling the imaging element to form an optical image of a photographic object;
a detection shake sensor for detecting camera shake;
an actuator for displacing or modifying a shiftable object as at least one element included in the optical system and the imaging element, in accordance with a camera shake amount;
a first circuit that functions as an optical camera shake correction module; and
at least one second circuit that functions as an electronic camera shake correction module, the at least one second circuit outputting a part of a photographed image, excluding a correction spare region and photographed by the imaging element, as an output image,
wherein the optical camera shake correction module includes
a calculation unit which calculates a camera shake amount of the optical system using a detection value of the shake detection sensor, and calculates a target operation position of the shiftable object based on the calculated camera shake amount, and
a position control unit which sets a position adjustment amount of an adjustment operation position of the shiftable object based on information representing a present operation position of the shiftable object and information representing a position of the output image with respect to the photographed image, and outputs a signal for controlling the adjustment operation position of the shiftable object based on the target operation position and the position adjustment amount,
wherein the photographed image has a quadrangle form defined by first and second sides corresponding to a row of the imaging element and third and fourth sides corresponding to a column of the imaging element,
wherein a photographable range of the imaging element corresponding to a mechanical shiftable range of the shiftable object is in a quadrangle range separated by a first space, a second space, a third space, and a fourth space from the first side, the second side, the third side, and the fourth side, the first to fourth spaces being determined in accordance with the adjustment operation position of the shiftable object,
wherein the output image of the electronic camera shake correction module has a quadrangle form separated by a fifth space, a sixth space, a seventh space, and an eighth space from the first side, the second side, the third side, and the fourth side, the fifth to eighth spaces being determined in accordance with the position of the output image, and
wherein the position control unit sets the position adjustment amount in a manner to further enlarge the first space, when the first space is smaller than a first threshold value, and when the fifth space is equal to or greater than a second threshold value.

* * * * *